(12) United States Patent
Ono et al.

(10) Patent No.: US 7,633,210 B2
(45) Date of Patent: Dec. 15, 2009

(54) MULTI-LAYER ELECTRONIC COMPONENT AND METHOD FOR MANUFACTURING THE SAME, MULTI-LAYER PIEZOELECTRIC ELEMENT

(75) Inventors: Susumu Ono, Kokubu (JP); Takeshi Okamura, Kokubu (JP); Katsushi Sakaue, Kokubu (JP); Takaaki Hira, Kokubu (JP); Masaki Terazono, Kokubu (JP)

(73) Assignee: Kyocera Corporation, Kyoto (JP)

( * ) Notice: Subject to any disclaimer, the term of this patent is extended or adjusted under 35 U.S.C. 154(b) by 502 days.

(21) Appl. No.: 10/566,044

(22) PCT Filed: Jul. 28, 2004

(86) PCT No.: PCT/JP2004/011130

§ 371 (c)(1),
(2), (4) Date: Nov. 29, 2006

(87) PCT Pub. No.: WO2005/011009

PCT Pub. Date: Feb. 3, 2005

(65) Prior Publication Data

US 2007/0069610 A1    Mar. 29, 2007

(30) Foreign Application Priority Data

Jul. 28, 2003 (JP) ............................. 2003-202735
Dec. 24, 2003 (JP) ............................. 2003-426901
Jan. 19, 2004 (JP) ............................. 2004-010936

(51) Int. Cl.
*H01L 41/083* (2006.01)
(52) U.S. Cl. ................. 310/328; 310/365; 310/366; 310/358
(58) Field of Classification Search ............ 310/358, 310/328, 365–366
See application file for complete search history.

(56) References Cited

U.S. PATENT DOCUMENTS 5,196,757 A * 3/1993 Omatsu .................. 310/358

(Continued)

FOREIGN PATENT DOCUMENTS

CN    1313641 A    9/2001

(Continued)

OTHER PUBLICATIONS

Chinese office action for corresponding Chinese application No. 200480021516.9 lists the references above.

(Continued)

*Primary Examiner*—J. SanMartin
(74) *Attorney, Agent, or Firm*—Hogan & Hartson LLP

(57) ABSTRACT

In order to provide a multi-layer electronic component in which the occurrence of delamination between the ceramic layer and the internal electrode is restricted and a method for manufacturing the same, the multi-layer electronic component of the present invention comprises a stack formed by stacking piezoelectric layers and internal electrodes one on another alternately and a pair of external electrodes formed on two opposing side faces of the stack, wherein the internal electrode consists of a first internal electrode connected to the external electrode formed on one of the two side faces and a second internal electrode located between the first internal electrode and connected to the external electrode formed on the other one of the two side faces, and wherein the internal electrodes and the piezoelectric layers are faced in proximity so that a space between them is 2 μm or less over an area occupying 50% or more of the active region where the first internal electrode and the second internal electrode oppose each other.

16 Claims, 10 Drawing Sheets

U.S. PATENT DOCUMENTS

| | | | | |
|---|---|---|---|---|
| 5,389,851 | A * | 2/1995 | Kimura et al. | 310/340 |
| 6,013,970 | A * | 1/2000 | Nishiwaki et al. | 310/330 |
| 6,097,133 | A * | 8/2000 | Shimada et al. | 310/358 |
| 6,140,746 | A * | 10/2000 | Miyashita et al. | 310/358 |
| 6,294,860 | B1 * | 9/2001 | Shimada et al. | 310/328 |
| 6,384,517 | B1 | 5/2002 | Kojima et al. | |
| 6,511,161 | B2 * | 1/2003 | Sumi et al. | 347/68 |
| 6,543,107 | B1 * | 4/2003 | Miyashita et al. | 29/25.35 |
| 6,887,397 | B2 * | 5/2005 | Yamaguchi et al. | 252/62.9 R |
| 7,193,756 | B2 * | 3/2007 | Murata et al. | 359/21 |
| 7,414,352 | B2 * | 8/2008 | Nanataki et al. | 310/358 |
| 7,506,441 | B2 * | 3/2009 | Yasui et al. | 29/890.1 |
| 7,525,241 | B2 * | 4/2009 | Florian et al. | 310/366 |
| 7,528,530 | B2 * | 5/2009 | Matsuda et al. | 310/358 |
| 7,560,854 | B2 * | 7/2009 | Ohashi et al. | 310/328 |
| 2007/0069610 | A1 * | 3/2007 | Ono et al. | 310/328 |
| 2007/0097182 | A1 * | 5/2007 | Kubota et al. | 347/70 |
| 2008/0233277 | A1 * | 9/2008 | Kubota et al. | 427/100 |
| 2008/0248277 | A1 * | 10/2008 | Yokoyama et al. | 428/220 |
| 2008/0303876 | A1 * | 12/2008 | Nihei | 347/70 |
| 2009/0045701 | A1 * | 2/2009 | Okamura et al. | 310/363 |
| 2009/0072673 | A1 * | 3/2009 | Fujii et al. | 310/358 |
| 2009/0170686 | A1 * | 7/2009 | Yura et al. | 501/135 |

FOREIGN PATENT DOCUMENTS

| | | |
|---|---|---|
| JP | 61-133715 | 6/1986 |
| JP | 01-130568 | 9/1989 |
| JP | 2540939 B2 * | 11/1990 |
| JP | 04-299588 | 10/1992 |
| JP | 05-217796 | 8/1993 |
| JP | 2540939 B2 | 10/1996 |
| JP | 2002-293625 | 10/2002 |
| JP | 2003-197991 | 7/2003 |

OTHER PUBLICATIONS

English language translation of Chinese office action for corresponding Chinese application 200810080741 lists the reference above.

* cited by examiner

MULTI-LAYER ELECTRONIC COMPONENT AND METHOD FOR MANUFACTURING THE SAME, MULTI-LAYER PIEZOELECTRIC ELEMENT

TECHNICAL FIELD

The present invention relates to a multi-layer electronic component and a method for manufacturing the same, and particularly to a multi-layer piezoelectric element and an injection apparatus constituted by using the element. More particularly, the present invention relates to a multi-layer piezoelectric element used for fuel injection apparatus of automobile engine, liquid ejecting apparatus of ink jet printer or the like or a drive unit used in precision positioning device or vibration preventing device for an optical apparatus, or to a multi-layer piezoelectric element used as a sensor element mounted in combustion pressure sensor, knocking sensor, acceleration sensor, load sensor, ultrasonic sensor, pressure sensor, yaw rate sensor or the like, or used as a circuit component mounted in piezoelectric gyro, piezoelectric switch, piezoelectric transformer, piezoelectric breaker or the like.

BACKGROUND ART

Use of multi-layer piezoelectric element made by alternately stacking piezoelectric layers and internal electrodes, for example, has been proposed for constituting a multi-layer electronic component in order to achieve a large displacement by making use of electrostrictive effect. The multi-layer piezoelectric element can be divided into two categories: fired-at-once type and stacked type where piezoelectric porcelain and internal electrode sheet are stacked one on another alternately. When the requirement to reduce the voltage and manufacturing cost are taken into consideration, the multi-layer piezoelectric element of fired-at-once type is more advantageous in order to decrease the layer thickness.

The multi-layer piezoelectric element of fired-at-once type is made similarly to a multi-layer ceramic capacitor by forming an active section by stacking green sheets that include a piezoelectric material and internal electrode sheet that includes an internal electrode material, forming an inactive section by stacking a plurality of the ceramic green sheets on the top and bottom surfaces of the active section, and degreasing and firing the stack.

In recent years, such a practice has been becoming common that a compact multi-layer piezoelectric actuator is operated continuously over an extended period of time with an electric field of higher intensity being applied thereto, in order to obtain a larger displacement under a high pressure.

In order to meet such a requirement, a multi-layer electronic component disclosed in Japanese Unexamined Patent Publication (Kokai) No. 4-299588 has column-like portion formed in an internal electrode layer from a material, that includes 10 to 20% of piezoelectric ceramic powder of which particle size is controlled within a range form ½ to 1 times the thickness of the internal electrode, so as to bridge between ceramic layers, thereby to prevent delamination of the internal electrode and the ceramic layer after firing.

However, in the multi-layer electronic component disclosed in Japanese Unexamined Patent Publication (Kokai) No. 4-299588, because of slow rate of cooling down after heat treatment in the process of connecting the internal electrode and an external electrode, there is a gap generated between the internal electrode and the ceramic layer over substantially the entire interface thereof in an area where column-like portion 51 is not formed, due to a difference in thermal expansion between the internal electrode 102 and the ceramic layer 101 as shown in FIG. 5, with the gap T larger than 2 µm in 50% or more of the entire interface. As a result, there has been such a problem that continuous operation over a long period in high electric field leads to delamination.

In a multi-layer electronic component disclosed in Japanese Unexamined Patent Publication (Kokai) No. 5-217796, occurrence of micro cracks that are generated during cutting and may cause shorting is prevented by subjecting a cut surface (external electrode forming surface) formed by mechanical processing of the device to a heat treatment that is applied at a temperature higher than that of the first firing.

However, because of a slow rate of cooling down carried out after the heat treatment applied at a temperature higher than the firing temperature, there has been peel-off occurring over substantially the entire interface thereof due to a difference in thermal expansion between the internal electrode and the ceramic layer. As a result, there has been such a problem that continuous operation over a long period in high electric field leads to delamination.

FIG. 7 shows a multi-layer piezoelectric element disclosed in Japanese Unexamined Patent Publication (Kokai) No. 61-133715, which is constituted from a stack 200 and external electrodes 223 formed on a pair of side faces that oppose each other. While the stack 200 is formed by stacking piezoelectric material 221 and internal electrode 222 one on another, the internal electrode 222 is not formed over the entire principal surface of the piezoelectric material 221, in a so-called partial electrode structure. The piezoelectric material is stacked such that the internal electrode 222 is placed in every other layer in a staggered manner so as to be exposed alternately at the left then at the right on different side faces of the stack 200. Then the external electrodes 223 are formed so that the internal electrodes 222 that are exposed to the pair of opposing side faces of the stack 200 are connected to each other, thereby connecting the internal electrodes 222 in every other layer.

The multi-layer piezoelectric element of the prior art may be manufactured by printing an internal electrode paste in the pattern of a predetermined electrode structure on a ceramic green sheet that includes the material of the piezoelectric material 221, stacking a plurality of the green sheets coated with the internal electrode paste so as to form a multi-layer green compact and firing the green compact thereby to make the stack 200. Then the external electrodes 23 are formed by firing on a pair of side faces of the stack 200, thereby to make the multi-layer piezoelectric element.

The internal electrode 222 is formed from an alloy of silver and palladium and, in order to fire the piezoelectric material 221 and the internal electrode 222 at the same time, composition of metals included in the internal electrode 222 was set to 70% by weight of silver and 30% by weight of palladium (refer to, for example, Japanese Unexamined Utility Model Publication (Kokai) No. 1-130568).

The internal electrode 222 is made of metal composition that includes silver-palladium alloy instead of pure silver because, when a voltage is applied between the pair of opposing internal electrodes 222 that are made of silver without palladium content, the so-called silver migration occurs in which silver atoms of the pair of internal electrodes 222 propagate along the device surface from the positive electrode to the negative electrode. Silver migration occurs conspicuously in an atmosphere of high temperature and high humidity.

In case a multi-layer piezoelectric element of the prior art is used as a piezoelectric actuator, it may be provided with lead wires (not shown) soldered onto the external electrodes 223 and operated by applying a predetermined voltage between the external electrodes 223. In recent years, since it is required to make a compact multi-layer piezoelectric element capable of achieving a large amount of displacement under a high pressure, continuous operation is carried out over a long period with a higher electric field applied.

Such a multi-layer piezoelectric element of fired-at-once type as described above is required to equalize the temperature at which the internal electrode 222 is sintered and the temperature at which the piezoelectric material 221 is sintered, and compositions of the materials used to form the internal electrode 222 and the piezoelectric material 221 have been studied. However, since this allows residual stress caused by the difference in thermal expansion between the internal electrode and the ceramic layer to be concentration in the crystal grains of the piezoelectric material 221 that faces the internal electrode 222, there has been such a problem that delamination occurs in which the internal electrode 222 peels off the piezoelectric material 221 during operation when the device is used as an actuator.

Particularly when those among the crystal grains of the piezoelectric material 221 that face the internal electrode 222 are small, such troubles occur as the value of dielectric constant becomes smaller than that of larger grains of the same composition due to the size effect, and the amount of piezoelectric displacement becomes smaller. Even when average crystal grain size of the crystal grains of the piezoelectric material 221 is made larger, if there are grains having small amount of piezoelectric displacement among the crystal grains of the piezoelectric material 221 that faces the internal electrode 222, smaller amount of displacement than that of the crystal grains of the piezoelectric material 221 during operation causes the residual stress generated due to the difference in thermal expansion between the internal electrode 222 and the ceramic layer 221 to be concentrated at one point thus making an initiating point for cracks and delamination.

There has also been such a problem that the mount of displacement varies due to the occurrence of delamination. When the rate of occurrence of delamination becomes higher, temperature of the device increases. When the heat generated by the device exceeds the heat that can be removed by dissipation, thermal excursion occurs, resulting in breakage and sudden failure to achieve the required amount of displacement. Therefore, there has been a demand for internal electrodes having lower specific resistance in order to suppress the device temperature from rising.

However, specific resistance of the silver-palladium alloy that has been used in the prior art is higher than that of a single-element metal such as silver or palladium depending on the composition of the alloy. For example, silver-palladium alloy including 70% by weight of silver and 30% by weight of palladium has specific resistance 1.5 times as high as that of palladium. Moreover, lower sintering density of the internal electrode 222 results in even higher resistance, thus posing a limitation to decreasing the specific resistance of the internal electrode 222.

When the conventional multi-layer piezoelectric element is used as an actuator for driving a fuel injection apparatus or the like as described above, there is a problem that the amount of displacement gradually changes resulting in malfunction of the apparatus. Therefore, it has been called for to suppress the amount of displacement from changing and improve durability during continuous operation over a long period.

For a multi-layer piezoelectric element, it is a common practice to carry out polarization treatment by applying a voltage of about 1 kV (refer to, for example, Japanese Unexamined Patent Publication (Kokai) No. 2002-293625). Specifically, in the polarization treatment disclosed in Japanese Unexamined Patent Publication (Kokai) No. 2002-293625, the multi-layer piezoelectric element having the external electrodes formed thereon is (1) immersed in a heated oil bath, (2) subjected to a voltage applied thereto, and (3) cooled down after decreasing the voltage.

However, in the polarization treatment disclosed in Japanese Unexamined Patent Publication (Kokai) No. 2002-293625, there is a problem that the crystal grains that constitute the piezoelectric material cannot undergo fully saturated polarization and, for example, particularly the amount of displacement among the piezoelectric characteristics decreases in an operation test conducted over a long period of time. This is because the degree of orientation of the crystal grains of the piezoelectric material changes more significantly through operation.

DISCLOSURE OF THE INVENTION

The present invention has been made to solve the problems described above, and has an object of providing a multi-layer electronic component in which the occurrence of delamination between the ceramic layer and the internal electrode is restricted and a method for manufacturing the same.

Particularly, it is an object of the present invention is to provide a multi-layer piezoelectric element that has excellent durability in which delamination is restricted from occurring during operation and the amount of displacement does not vary even when the piezoelectric actuator is subjected to continuous operation over a long period under a high voltage and a high pressure, and an injection apparatus using the same.

Another object of the present invention is to provide a multi-layer piezoelectric element wherein crystal grains of the piezoelectric material experience less change in the is degree of orientation through operation so that the piezoelectric characteristics undergo less degradation in an operation test over a long period of time and a method for manufacturing the same, and an injection apparatus using the same.

In order to achieve the objects described above, the multi-layer electronic component of the present invention comprises a stack formed by stacking piezoelectric layers and internal electrodes one on another alternately and a pair of external electrodes formed on two opposing side faces of the stack, wherein the internal electrode consists of a first internal electrode connected to the external electrode formed on one of the two side faces and a second internal electrode located between the first internal electrode and connected to the external electrode formed on the other one of the two side faces, and wherein the internal electrodes and the piezoelectric layers are faced in proximity so that a space between them is 2 µm or less over an area occupying 50% or more of the active region where the first internal electrode and the second internal electrode oppose each other.

The region where the first internal electrode and the second internal electrode oppose each other is a portion which performs the function of the multi-layer electronic component, and will be referred to as an active region or active section in this specification. One of the first internal electrode and the second internal electrode is a positive electrode and the other is a negative electrode.

In the multi-layer electronic component of the present invention, it is preferable that change in the degree of orientation of the crystal grains that constitute the piezoelectric layer is limited to within 5% after repeated operations.

By restricting the change in the degree of orientation of the crystal grains that constitute the piezoelectric layer through operation to not more than 5%, degradation in piezoelectric characteristics, particularly the amount of displacement, can be made small after operation over a long period of time, thus ensuring high reliability.

In case the ceramic layer is formed from the piezoelectric material, the crystal grains of the piezoelectric layer preferably have average grain size of 2.5 μm or less. The crystal grains that constitute the piezoelectric layer having average grain size of 2.5 μm or less can have the degree of orientation of the crystal grains increased by the polarization treatment, and the change in polarizability can be further decreased.

The multi-layer piezoelectric element of the present invention wherein the ceramic layer is formed from a piezoelectric material experiences less deterioration after repetitive operations of more than $10^9$ cycles under such conditions as, for example, load of 150 kgf, temperature of 150° C. and frequency of 50 Hz, and has sufficient performance applicable to an injection apparatus that requires high reliability in continuous operation.

In case the ceramic layer is formed from the piezoelectric material, thickness of the piezoelectric layer is preferably 200 μm or less, which enables it to apply sufficiently high electric field in the direction of thickness, thus allowing it to carry out saturation polarization.

Thickness of the internal electrode is preferably 5 μm or less in order to achieve higher conductivity in the direction of thickness of the internal electrode, which enables it to further improve the degree of orientation and polarizability of the crystal grains of the piezoelectric material.

The internal electrode may also include an inorganic component other than the metal included as the major component.

When an inorganic component is included in the internal electrode of the multi-layer piezoelectric element, the inorganic component is preferably the same as that of the piezoelectric layer, and average particle size of the inorganic component is preferably smaller than that of the piezoelectric layer.

According to the present invention, by including the same inorganic component as that of the piezoelectric particles that constitute the piezoelectric layer in the internal electrode, and making the average particle size of the inorganic component included in the internal electrode smaller than that of the piezoelectric layer, it is made possible to increase the effective area of the internal electrode as the particles of the piezoelectric material that make contact with the internal electrode become smaller, while suppressing the rigidity of the internal electrode from increasing due to the addition of the inorganic component, thereby increasing the bonding strength with the piezoelectric layer and allowing it to apply electric field of higher intensity.

The method of manufacturing the multi-layer electronic component of the present invention comprises a process of forming a column-like stack by stacking a plurality of ceramic layers and a plurality of internal electrodes alternately one on another, a process of trimming the column-like stack to desired dimensions, a process of applying heat treatment to the column-like stack, a process of applying an electrically conductive paste on the side face of the column-like stack, a process of applying heat treatment to the electrically conductive paste and form a pair of external electrodes that are connected to the internal electrode alternately in every other layer, and a process of applying a voltage to the external electrodes and carrying out polarization treatment so that the change in the ratio of lattice constants c/a becomes 0.5% or less.

In the method of manufacturing the multi-layer electronic component of the present invention, it is preferable that the rate of cooling down from the maximum temperature of heat treatment is set to t/3 (° C./minute) or less in the process of applying heat treatment to the electrically conductive paste, where t (° C.) is Curie temperature of the ceramic layer.

In the method of manufacturing the multi-layer electronic component of the present invention, it is also preferable that the rate of cooling down in a temperature range from 1.2 t to 0.8 t in the heat treatment is set to t/3 (° C./minute) or less in the process of applying heat treatment to the electrically conductive paste.

According to the present invention, as described above, the multi-layer electronic component of high reliability where delamination is suppressed from occurring can be provided.

A second multi-layer piezoelectric element of the present invention comprises a stack formed by stacking piezoelectric layers and internal electrodes alternately, wherein average crystal grain size of a portion of the piezoelectric material that makes contact with the internal electrode is larger than the average crystal grain size of the other portion.

A third multi-layer piezoelectric element of the present invention comprises a stack formed by stacking piezoelectric layers and internal electrodes alternately, wherein minimum crystal grain size of a portion of the piezoelectric material that makes contact with the internal electrode is larger than the minimum crystal grain size of other portion.

An injection apparatus according to the present invention comprises a container that has an injection hole leading to a fuel passage, a piston that is housed in the container for opening and closing the communication between the fuel passage and the injection hole, and the multi-layer piezoelectric element that is housed in the container and drives the piston, wherein the multi-layer piezoelectric element comprises a stack formed by stacking the piezoelectric layers and the internal electrodes alternately, while the average crystal grain size of a portion of the piezoelectric material that makes contact with the internal electrode is larger than the average crystal grain size of the other portion.

In the second and third multi-layer piezoelectric elements of the present invention constituted as described above, by making the average crystal grain size or the minimum crystal grain size of a portion of the piezoelectric material that makes contact with the internal electrode is made larger than the average crystal grain size or the minimum crystal grain size of the other portion, it is made possible to distribute the residual stress cased by difference in thermal expansion between the internal electrode and the piezoelectric layer uniformly throughout the piezoelectric particles in the interface of electrodes. This enables it to increase the bonding strength of the internal electrode and the piezoelectric material in the interface thereof, thereby enabling it to suppress delamination from occurring and provide a piezoelectric actuator of excellent durability and high reliability where the amount of displacement is suppressed from decreasing during operation.

The multi-layer piezoelectric element of the present invention, since the amount of displacement does not substantially change in continuous operation, enables it to constitute the injection apparatus of excellent durability and high reliability that includes the multi-layer piezoelectric element and is capable of operating without failure.

BEST MODE FOR CARRYING OUT THE INVENTION

First Embodiment

Figure 1:
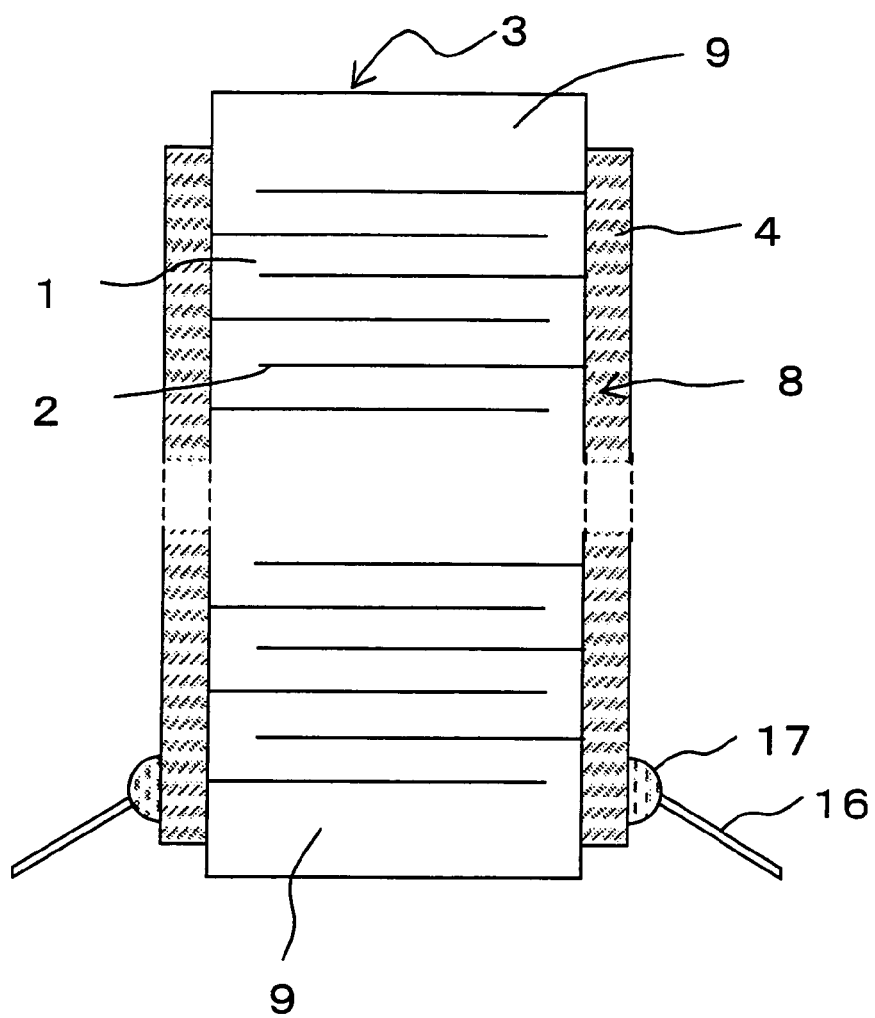
FIG. 1 is a side view of a multi-layer electronic component according to the first embodiment of the present invention.

FIG. 1 is a longitudinal sectional view showing the constitution of a multi-layer electronic component (multi-layer piezoelectric actuator) according to the first embodiment of the present invention.

The multi-layer electronic component of the first embodiment has a column-like stack 3 of a rectangular prism shape comprising an active section 8 formed by stacking a plurality of ceramic layers 1 and a plurality of internal electrodes 2 alternately one on another, and inactive sections 9 provided on both ends of the active section 8 in the direction of stacking, as shown in FIG. 1.

The ceramic layer 1 is made of a piezoelectric ceramic material of which main component is lead zirconate titanate $Pb(Zr, Ti)O_3$ (hereinafter abbreviated as PZT) or barium titanate $BaTiO_3$, for example, but is not limited to this composition and may be made of any ceramic material that has piezoelectric property. The piezoelectric material preferably has a high value of piezoelectric strain constant $d_{33}$.

The thickness of the ceramic layer 1, namely the distance between the internal electrodes 2, is preferably in a range from 0.05 to 0.25 mm in order to make the construction smaller and apply high electric field. This is because, while a larger displacement of the multi-layer piezoelectric element under a given voltage is achieved by stacking a larger number of piezoelectric layers, thick ceramic layers 1 stacked in the active section 8 make it impossible to make an actuator of smaller size and lower profile when the number of stacked layers is increased, but insulation breakdown may be caused when the ceramic layers 1 stacked in the active section 8 are too thin.

The internal electrodes 2 are formed in a rectangular shape a little smaller than the ceramic layer, and are disposed so that one side thereof is exposed on either one of opposite side faces (external electrode forming surface) of the column-like stack every other layer as shown in FIG. 1, while the external electrode 4 is connected on the opposing side faces of the column-like stack 3 whereon one side of the internal electrode 2 is exposed. As a result, the internal electrodes 2 are electrically connected to the external electrodes 4 alternately on every other layer.

In the multi-layer electronic component of the first embodiment, gap between the internal electrode 2 and the ceramic layer 1 of 2 μm or less is controlled over an area of 50% or more of the interface between the internal electrode 2 and the ceramic layer 1. In this way it is important in the multi-layer electronic component of the first embodiment, that gap between the internal electrode 2 and the ceramic layer 1 is controlled to 2 μm or less over an area of 50% or more of the effectively active region. This enables it to suppress the occurrence of delamination, cracks or the like, thereby to achieve high reliability.

When the gap between the internal electrode 2 and the ceramic layer 1 is controlled to 2 μm or less over an area of less than 50% of the effectively active region, cracks may occur in the gap when operated with an electric field of high intensity, thus resulting in low reliability. In order to reduce crack initiating points and improve the reliability, the gap between the internal electrode 2 and the ceramic layer 1 is more preferably controlled to 2 μm or less over an area of 70% or more of the effectively active region.

Figure 2:
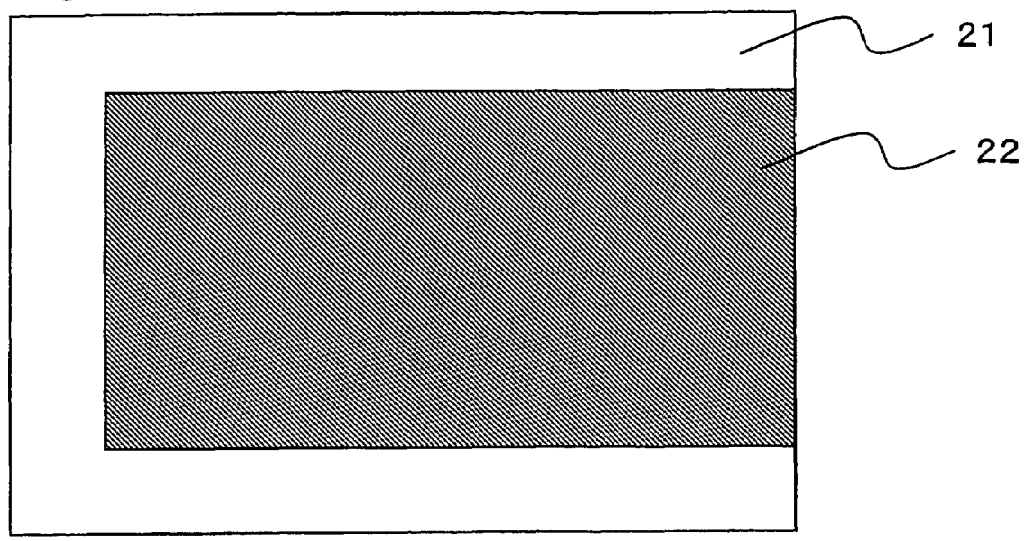
FIG. 2 is a plan view of a ceramic sheet that constitutes the multi-layer electronic component of the first embodiment.

According to the method of manufacturing the multi-layer electronic component of the present invention, a slurry is prepared by mixing a calcinated powder of piezoelectric ceramics (ceramic powder) such as lead zirconate titanate $Pb(Zr, Ti)O_3$, an organic binder made of an organic polymer such as acrylic resin or butyral resin and a plasticizer, and the slurry is formed into a ceramic green sheet 21 having thickness of 50 to 250 μm as shown in FIG. 2 by, for example, slip casting method.

According to the present invention, average grain size of calcinated ceramic powder that constitutes the ceramic layer 2 (included in the ceramic green sheet 21) is preferably in a range from 0.3 to 0.9 μm. By controlling the average grain size of the calcinated ceramic powder to 0.3 μm or larger, it is made possible to reduce the quantity of the organic binder required to prevent drying crack from occurring when making the ceramic green sheet 21.

By controlling the average grain size of calcinated ceramic powder to 0.9 μm or smaller, it is made possible to have the sintering process progress sufficiently and increase the strength of porcelain, thereby to suppress the occurrence of cracks due to stress generated by the electric field, for example, in the multi-layer piezoelectric element.

Thickness of the ceramic green sheet 21 is preferably 90 μm or larger, more preferably 100 μm or larger, in order to ensure a high dielectric breakdown voltage of the ceramic layer 1 after firing. In order to prevent cracks from occurring in the ceramic green sheet 21 during handling, it is preferable to use butyral resin that has high tensile strength for the organic binder.

Then after punching through the ceramic green sheet 21 into predetermined dimensions, an electrically conductive paste, that includes silver-palladium alloy which makes the internal electrode 2 and a solvent, is applied to one side of the ceramic green sheet 21 to a thickness of 1 to 10 μm as shown in FIG. 2 by screen printing process, and is dried to form the internal conductor pattern 22.

The internal conductor pattern 22 has a shape of rectangle having an area a little smaller than the ceramic green sheet 21 of rectangular shape. One side of the internal conductor pattern 22 is aligned with one side of the ceramic green sheet 21, while the other side is not.

Figure 3:
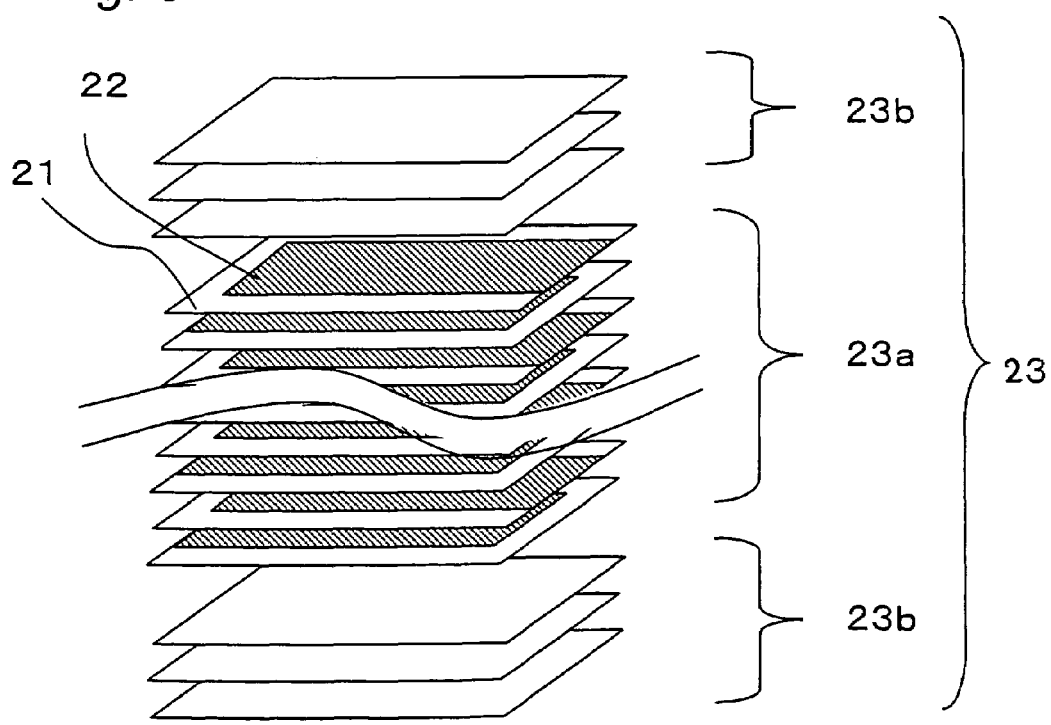
FIG. 3 is an exploded perspective view of a multi-layer green compact that constitutes the multi-layer electronic component of the first embodiment.

Then as shown in FIG. 3, a predetermined number of the ceramic green sheets 21 whereon the internal conductor pattern 22 is formed are stacked so that one side of the internal conductor pattern 22 is exposed on one side of the multi-layer green compact 23 in one layer and the opposite side of the internal conductor pattern 22 is exposed on the opposite side of the multi-layer green compact 23 in the next layer, so as to form an active section multi-layer green compact 23a. Then an inactive section green compact 23b formed by stacking a plurality of ceramic green sheets 21 without electrically conductive paste printed thereon are stacked on the top and bottom surfaces of the active section multi-layer green compact 23a, thereby making the multi-layer green compact 23.

The multi-layer green compact 23 may also be made by, after making the lower inactive section multi-layer green compact 23b by stacking the plurality of ceramic green sheets 21 without electrically conductive paste printed thereon, stacking a plurality of ceramic green sheets 21 having the internal conductor pattern 22 formed thereon on the lower inactive section multi-layer green compact 23b to form the active section multi-layer green compact 23a, and stacking a plurality of ceramic green sheets 21 without electrically conductive paste printed thereon on the active section multi-layer green compact 23a thereby to form the upper inactive section multi-layer green compact 23b.

There is no limitation to the method of manufacturing the multi-layer green compact 23, as long as the multi-layer green compact 23 comprising the ceramic green sheets 21 and the internal conductor pattern 22 being stacked one on another is obtained.

The multi-layer green compact 23 is pressurized while being heated so as to integrate the multi-layer green compact 23 and obtain a column-like multi-layer stack.

Pressure is preferably applied by isostatic pressing in order to ensure high precision of stacking, with the pressure preferably in a range from 20 to 120 MPa.

Figure 4:
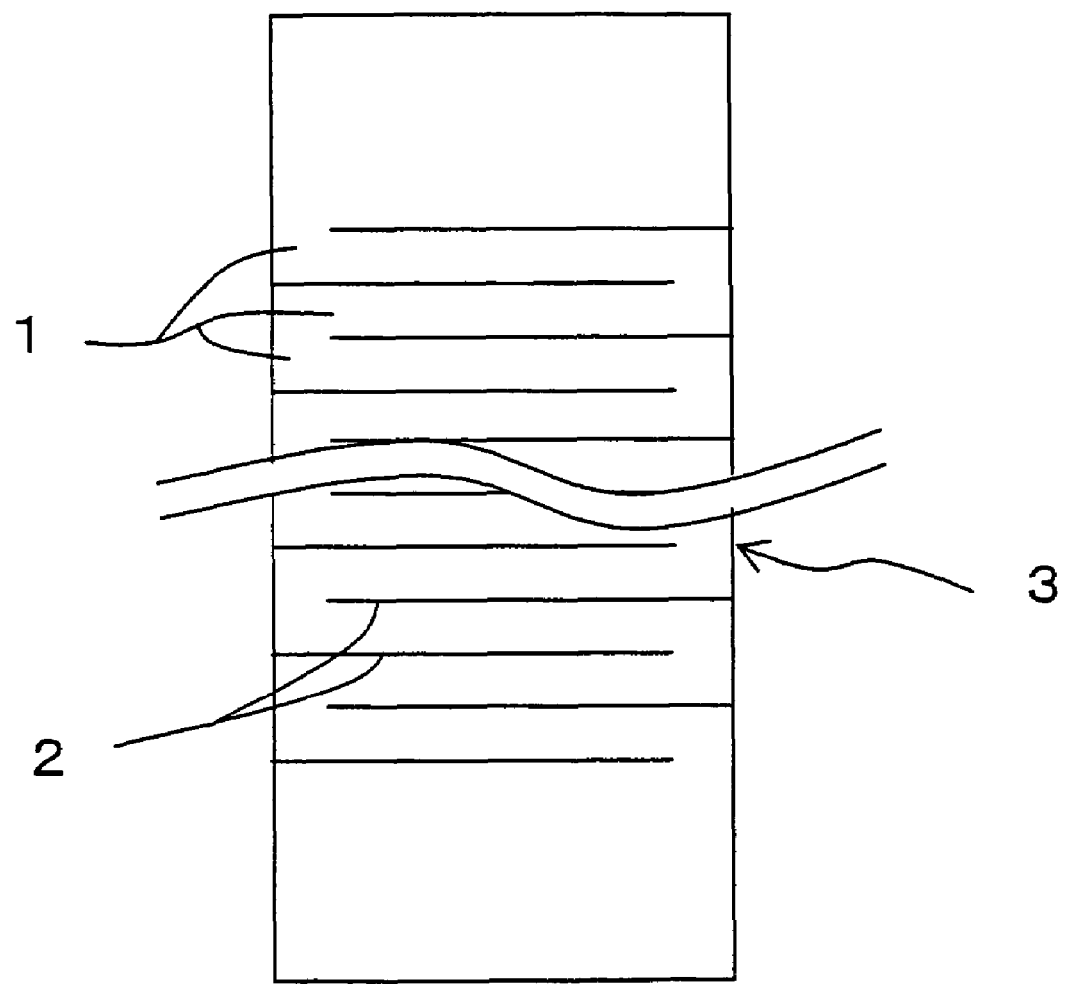
FIG. 4 is a sectional view of a stacked structure that constitutes the multi-layer electronic component of the first embodiment.
Figure 5:
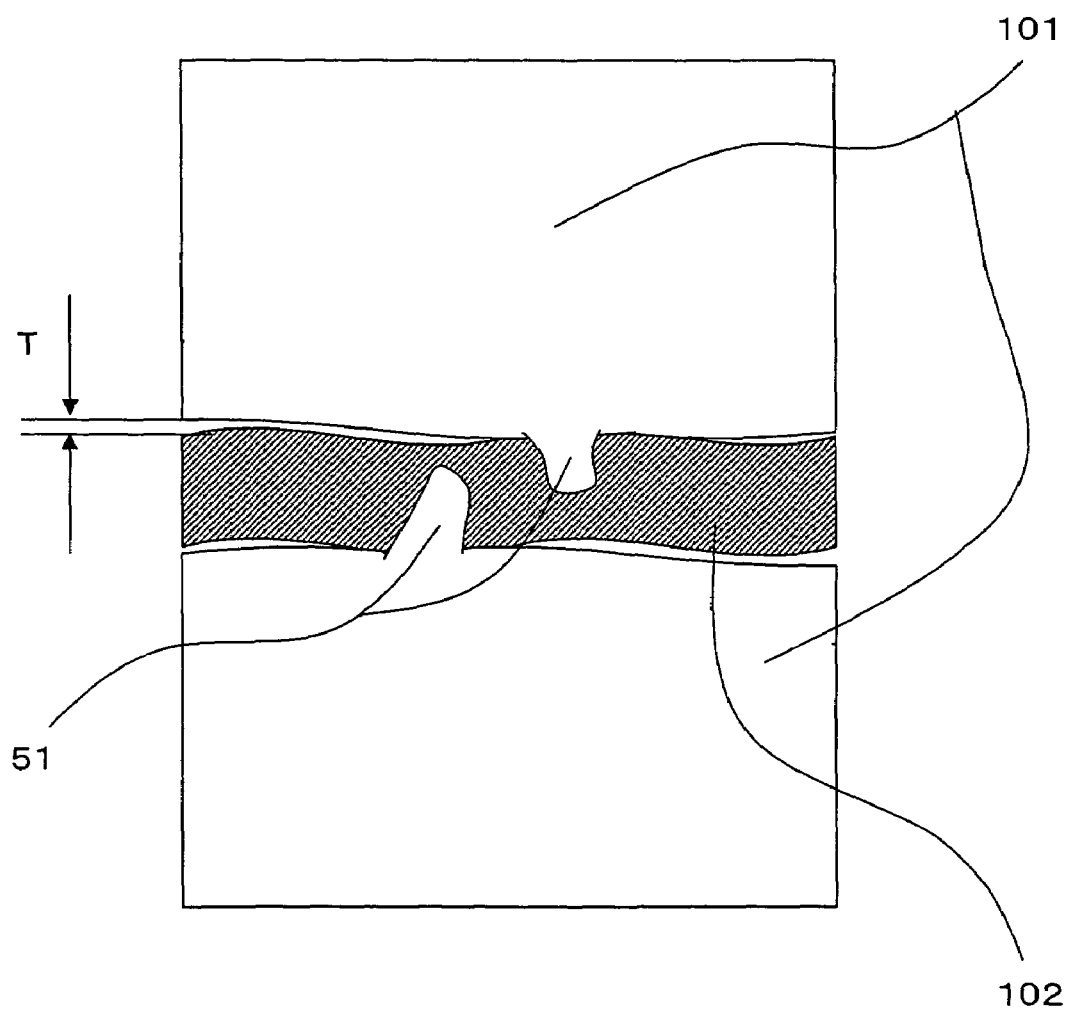
FIG. 5 shows defects formed between a ceramic layer and an internal electrode of a multi-layer electronic component of the prior art.

The column-like multi-layer stack that has been integrated is cut into a predetermined size and degreased in atmosphere at a temperature from 400 to 800° C. for a period of 5 to 40 hours. Then the column-like stack is fired at a temperature from 900 to 1200° C. for a period of 2 to 5 hours, so as to obtain the column-like stack 3 as shown in FIG. 4. The column-like stack 33 has the active section formed by stacking the ceramic layers (piezoelectric material layers) 1 and the internal electrodes 2 alternately, with one side of the internal electrode 2 being exposed alternately on the opposing side faces of the stack.

A DC voltage of 0.1 to 3 kV/mm is applied between a pair of external electrodes 4 so as to apply polarization treatment to the column-like stack, thereby to complete the multi-layer electronic component as the final product. It is important that the change in ratio of lattice constants c/a after the polarization is not larger than 0.5%. This is because the internal electrode 2 may be peeled off the ceramic layer 1 due to the stress generated during the polarization treatment when the change in the ratio c/a is larger than 0.5%. According to the present invention, in order to prevent peel-off due to the stress generated during the polarization, the change in the ratio c/a is more preferably less than 0.2%. The ratio of lattice constants c/a is determined by calculating the lattice constant a from a peak of plane (200) from XRD diffraction pattern and calculating the lattice constant c similarly from a peak of plane (002).

The manufacturing method described above enables it to control the gap between the internal electrode 2 and the ceramic layer 1 to 2 μm or less. When the gap between the internal electrode 2 and the ceramic layer 1 is larger than 2 μm, such troubles may occur as cracks occur in the gap when a high voltage is applied or during continuous operation over a long period, thus resulting in low reliability. While the constitution of the present invention is capable of preventing peel-off from occurring in the multi-layer electronic component, a gap larger than 2 μm may be generated in part of the interface due to mixing of foreign matter in the process. However, satisfactory reliability can be maintained if the gap is not larger than 2 μm over 50% or more of the active section.

Then a silver-palladium alloy that includes silver as a main component is applied to the side face of the column-like stack 3 where the end of the internal electrode 2 is exposed as shown in FIG. 1, and such a heat treatment is carried out as the temperature is lowered from the maximum temperature of heat treatment in a range from 500 to 900° C. at a rate of t/3 (° C./minute) or less where t (° C.) is Curie temperature of the ceramic layer 1, thereby to form the external electrode 4. Thus the internal electrodes 2 are connected to the external electrodes 4 in a staggered manner in every other layer.

A cooling rate faster than t/3 (° C./minute) may lead to stress generated in the interface between the internal electrode 2 and the ceramic layer 1 due to the difference in thermal expansion between the two materials, thus resulting in delamination or cracks.

The cooling rate in a temperature range from 1.2 t to 0.8 t (° C.) is preferably t/3 (° C./minute) or lower. The ceramic layer 1 is formed in cubic crystal system when the temperature is higher than the Curie temperature, and is formed in rhombohedral crystal system or tetragonal crystal system when the temperature is lower than the Curie temperature, and therefore delamination is more likely to occur due to the internal stress as the crystal layer changes when the cooling rate is made faster over the temperature range in which the crystal layer changes.

The gap between the internal electrode 2 and the ceramic layer 1 can be checked by inspecting a fracture surface by ultrasonic flaw detection or SEM observation. It is preferable to employ the ultrasonic flaw detection technique because it enables it to determine the distribution of gaps throughout the multi-layer electronic component easily without destructing it, although size of the gap can also be determined by SEM observation of a fracture surface. In case the fracture surface that is polished to mirror finish is observed with SEM, the internal electrode 2 extends into a gap due to the ductility of the internal electrode 2, and therefore it is important to observe a fracture surface. Based on the observation of a surface perpendicular to the stacking direction by ultrasonic flaw detection, ratio of peel off is determined from the ratio of the area where peel-off of 2 μm or larger to the area where there is no such large peel-off.

When ultrasonic flaw detection is employed, cross sections of a plurality of layers may be observed at the same time. Sensitivity of the ultrasonic flaw detection technique generally becomes lower when the depth of focus is increased. Therefore, samples that are constituted from a large number of stacked layers and have height of 5 mm or more are preferably divided by cutting to a height of 2 to 5 mm in a direction perpendicular to the stacking direction, so that each of the divided portions is subjected to ultrasonic flaw detection to determine the peel-off ratio. It suffices that portions, where the gap between the internal electrode 2 and the ceramic layer 1 is not larger than 2 μm, occupy 50% or more of the effectively active region in portions where fracture can easily initiate due to stress generated by operation, stress generated by electric field and stress generated by buckling, particularly in the vicinity of the top and bottom portions in the stacking direction and at least in a portion near the center.

In the form described above, one column-like stack is made from one multi-layer green compact 23 as shown in FIG. 3. However, it needs not to say that the present invention can be applied to the manufacture of the multi-layer electronic component in which a plurality of internal electrode patterns are formed on one ceramic green sheet 21, a plurality of the ceramic green sheets 21 are stacked one on another so as to make the multi-layer green compact from which a number of column-like stacks can be made, the stacked green compact is cut into pieces of predetermined dimensions and make a number of the column-like stacks shown in FIG. 2 at the same time.

For the multi-layer electronic component of the present invention, proportion of cross section of the stacked layer occupied by the internal electrode 2 is preferably as high as possible in order to prevent the internal electrode 2 and the ceramic layer 1 from peeling off in the interface thereof. Proportion of the internal electrode 2 is preferably 70% or more, in particular.

The method of manufacturing the multi-layer electronic component of the present invention is preferably used in the manufacture of multi-layer electronic component such as multi-layer piezoelectric transformer, multi-layer capacitor or multi-layer piezoelectric actuator. The method of manufacturing the multi-layer electronic component of the present invention is particularly preferable for the manufacture of multi-layer piezoelectric actuator formed from piezoelectric ceramics that is continuously operated by applying a high electric field.

Second Embodiment

The multi-layer piezoelectric element according to the second embodiment of the present invention will be described in detail below.

Figure 6A:
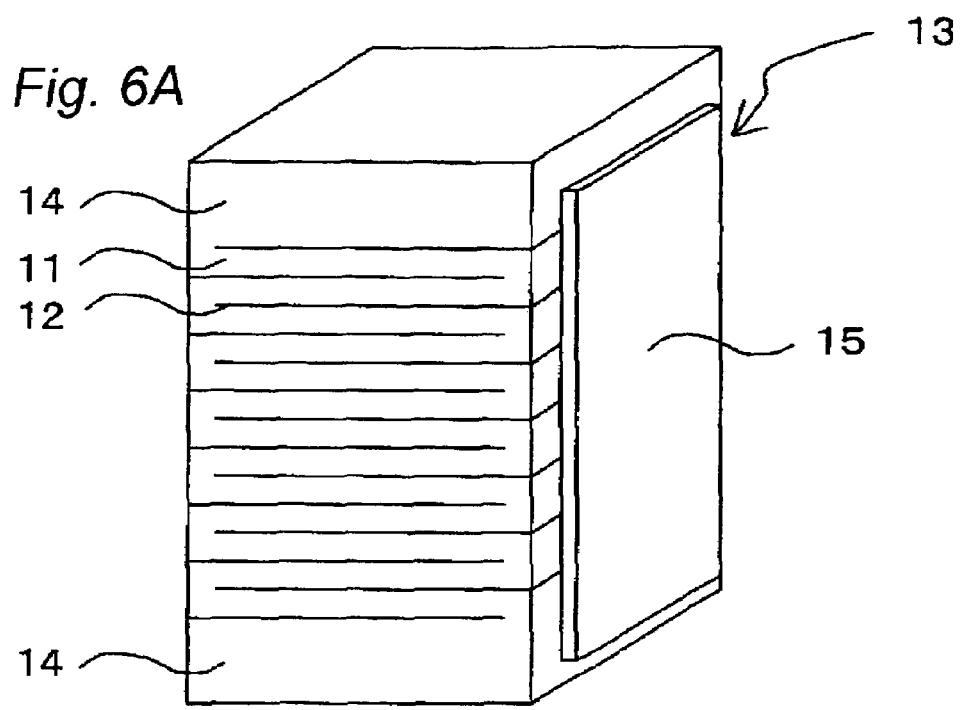
FIG. 6A is a perspective view of the constitution of a multi-layer piezoelectric element according to the second embodiment of the present invention.
Figure 6B:
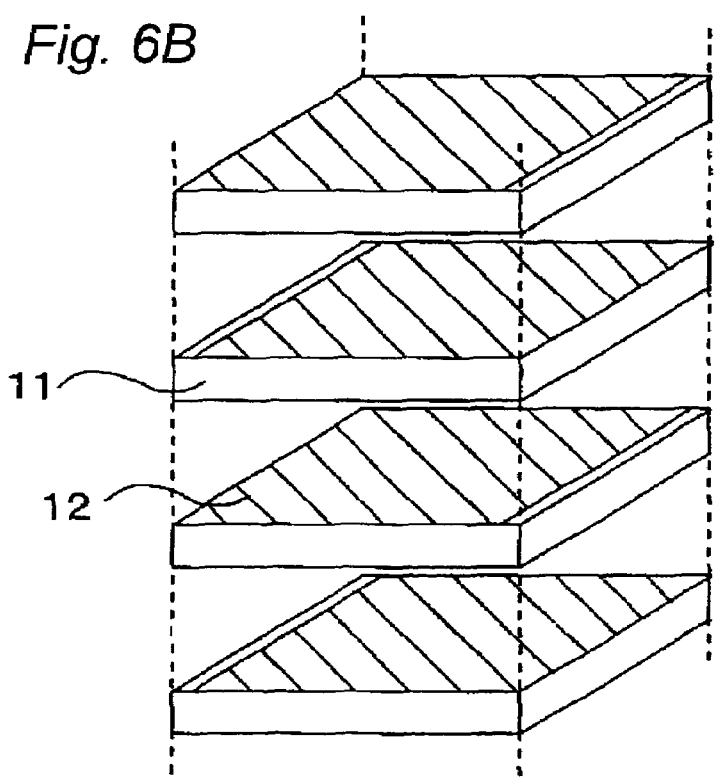
FIG. 6B is an exploded perspective view of stacked structure of piezoelectric layer and internal electrode according to the second embodiment.
Figure 7:
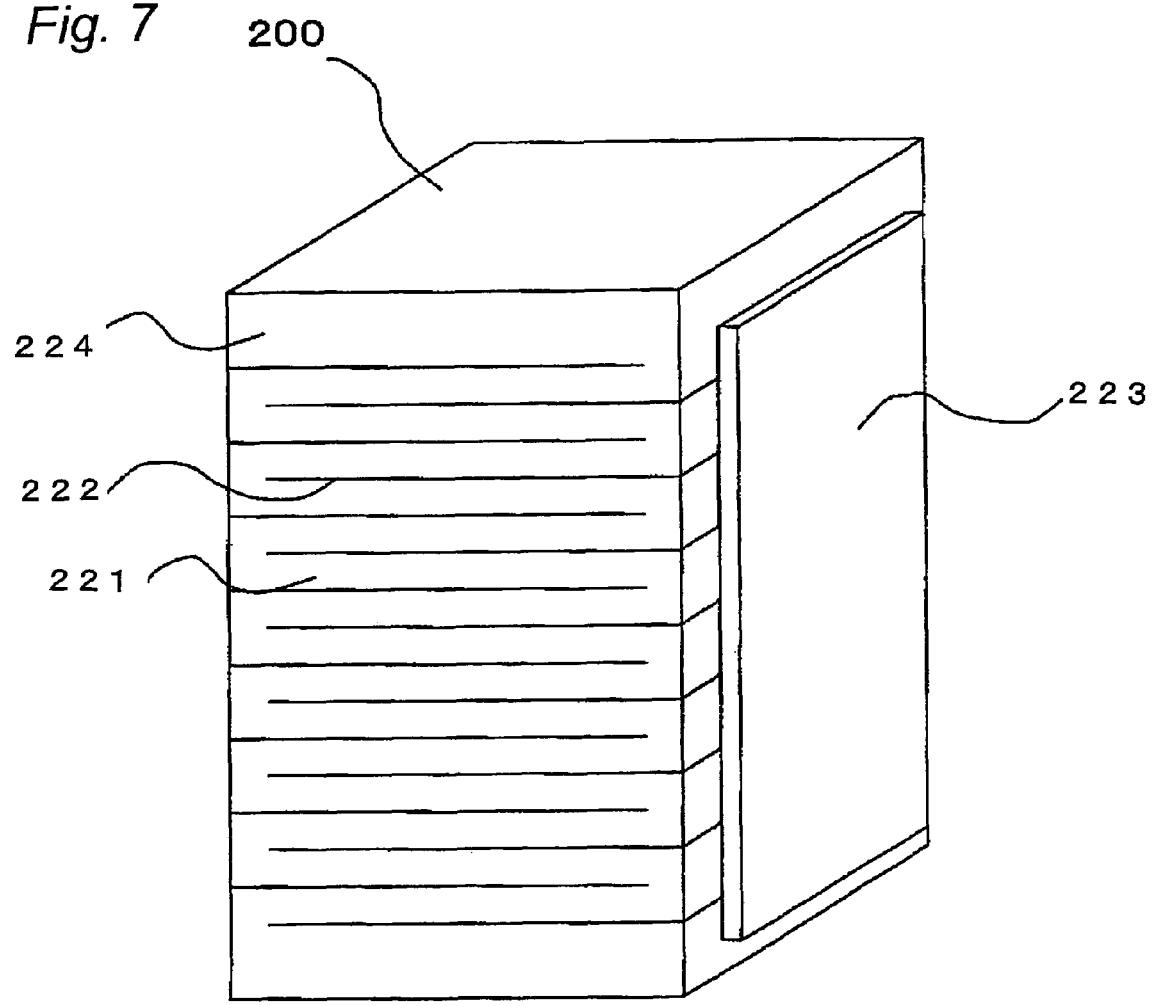
FIG. 7 is a perspective view of a multi-layer capacitor of the prior art.

FIG. 6A is a perspective view showing the structure of a multi-layer piezoelectric element according to the second embodiment. FIG. 6B is an exploded perspective view of the inner structure of the multi-layer piezoelectric element according to the second embodiment, showing the stacked structure of the piezoelectric layers and the internal electrodes.

In the multi-layer piezoelectric element according to the second embodiment, as shown in FIG. 6A, B, external electrodes 15 are connected so as to establish electrical continuity with the ends of the internal electrodes 12 that are exposed in every other layer on a pair of opposing side faces of the stack 13 that is formed by alternately stacking the piezoelectric layers 11 and the internal electrodes 12 one on another. Layers on both ends in the stacking direction of the stack 13 are the layers formed by stacking a plurality of piezoelectric layers 11 without interposing any electrode layer therein, and are called inactive layers 14 since they are not subjected to voltage and do not expand or shrink during operation. When the multi-layer piezoelectric element according to the second embodiment constituted as described above is used as a multi-layer piezoelectric actuator, lead wires may be soldered to the external electrodes 15 and connected to an external voltage source.

In an active region in which the internal electrodes 12 made of a metallic material such as silver-palladium alloy are disposed between the piezoelectric layers 11, a predetermined voltage is applied to the piezoelectric layers 11 via the internal electrodes 12, so that the piezoelectric layers 11 undergo displacement through reverse piezoelectric effect.

The inactive layer 14, in contrast, is constituted from a plurality of piezoelectric layers 11 without internal electrode 12 provided therein, and therefore does not undergo displacement even when a voltage is applied.

The multi-layer piezoelectric element of the second embodiment is characterized in that the average crystal grain size of the piezoelectric layer 11 that faces the internal electrode 12 is larger than the average crystal grain size of the other portions, so that the characteristic effects to be described later can be achieved. The region of the piezoelectric layer 11 that faces the internal electrode 12 herein refers to a region in the vicinity of the interface that is in contact with the internal electrode 12, and includes the region located near the periphery of the internal electrode 12.

In the second embodiment, the average crystal grain size of the piezoelectric layer 11 that faces the internal electrode 12 is preferably in a range from 1 to 8 µm.

When the average crystal grain size is smaller than 1 µm, the amount of piezoelectric displacement decreases due to the size effect, and bending strength or the so-called porcelain strength decreases. When minimum crystal grain size is larger than 8 µm, fracture mode changes from intergranular fracture to intragranular fracture, thus resulting in smaller bending strength or the so-called porcelain strength.

Also in the second embodiment, the minimum crystal grain size of the piezoelectric layer 11 that faces the internal electrode 12 may be made larger than the minimum crystal grain size of the other portions.

Reference is made here to the minimum crystal grain size because residual stress caused by the difference in thermal expansion between the internal electrode 12 and the ceramic layer 11 is concentrated in small crystal grains among the crystal grains located in the interface of the internal electrode 12.

According to the second embodiment, the minimum crystal grain size in the region that makes contact with the internal electrode 12 is preferably in a range from 0.5 to 5 µm. When the minimum crystal grain size is less than 0.5 µm, the amount of piezoelectric displacement becomes smaller due to the size effect and bending strength or the so-called porcelain strength becomes smaller. When the minimum crystal grain size is larger than 5 µm, fracture mode changes from intergranular fracture to intragranular fracture, thus resulting in smaller bending strength or the so-called porcelain strength.

The average crystal grain size and the minimum crystal grain size can be measured by means of SEM (scanning electron microscope). Specifically, the average crystal grain size of the piezoelectric layer 11 that faces the internal electrode 12 can be measured by drawing a straight line over the image of the crystal grains of the piezoelectric layer 11 that faces the internal electrode 12 captured by the SEM, measuring the length of line segment enclosed within the boundary of each of randomly selected 50 crystal grains and averaging the measurements. The present invention defines the average crystal grain size in the other portion of the piezoelectric layer 11 that faces the internal electrode 12. The average crystal grain size of the other portion is also determined similarly to the above except for drawing a straight line at an arbitrary position in a region other than the piezoelectric layer 11 that faces the internal electrode 12.

The minimum crystal grain size is defined as the smallest grain size among the crystal grains shown in the same area of the image where the average crystal grain size was measured at the two positions described above (the region of the piezoelectric layer that faces the internal electrode 12 and other region).

In the second embodiment, the average crystal grain size of the piezoelectric layer 11 that faces the internal electrode 12 is made larger than the average crystal grain size of the other portions by adjusting the composition of the material such that sintering starting temperature at which sintering of the internal electrode 12 begins is lower than sintering starting temperature at which sintering of the piezoelectric material 11 begins in the manufacturing process.

Specifically, the electrode pattern is printed with a paste that includes a powder of the metal that constitutes the internal electrode 12 and oxide of that metal as well, so that a liquid phase can be formed in the interface between the piezoelectric layer 11 and the internal electrode 12 at a temperature lower than the sintering starting temperature at which sintering of the piezoelectric material 11 begins.

By controlling the sintering starting temperature at which sintering of the internal electrode 12 begins lower than the sintering starting temperature at which sintering of the piezoelectric material 11 begins, it is made possible that liquid phase is formed first in the internal electrode 12 so that sintering of the internal electrode 12 proceeds.

In addition, the piezoelectric layer 11 and the internal electrode 12 are caused to be sintered in liquid phase as the liquid phase is created when the internal electrode 12 is sintered.

That is, liquid phase is intentionally formed in the interface of the electrode and sintering of the piezoelectric porcelain proceeds in a portion that makes contact with the internal electrode 12 so that portions that have smaller grain size disappear from the interface of the electrode with the progress of sintering, thus resulting in growing grain size in the portion that makes contact with the internal electrode 12 and increasing strength of bonding of the interface of the electrode.

According to the manufacturing method described above, the minimum crystal grain size of piezoelectric layer 11 that faces the internal electrode 12 can also be made larger than that of the other portions. However, in order to make the minimum crystal grain size of the piezoelectric layer 11 that faces the internal electrode 12 larger, it is necessary to diffuse the liquid phase, that is formed when sintering the electrode, into the piezoelectric material 11. For this reason, temperature is raised to that of sintering the piezoelectric material 11 after holding the firing temperature at the liquid phase forming temperature.

According to the second embodiment, metal composition in the internal electrode preferably includes group VIII metal and/or group Ib metal as the main component. Such a metal composition has high heat resistance and therefore allows it to sinter the piezoelectric material 11 that has a high sintering temperature and the internal electrode 12 at the same time.

When the metal composition in the internal electrode 12 includes group VIII metal and/or group Ib metal as the main component, proportion M1 (% by weight) of group VIII metal and proportion M2 of group Ib metal preferably satisfy the relations 0<M1≦15, 85≦M2<100 and M1+M2=100.

This is because a proportion of group VIII metal higher than 15% by weight leads to a high specific resistance of the internal electrode 12, resulting in heat generated by the internal electrodes 12 when the multi-layer piezoelectric element is operated continuously. In order to prevent group Ib metal included in the internal electrode 12 from diffusing into the piezoelectric material 11, concentration of group VIII metal is preferably controlled in a range from 0.001% by weight to 15% by weight. In view of higher durability of the multi-layer piezoelectric element, concentration of group VIII metal is preferably in a range from 0.1% by weight to 10% by weight. When high heat conductivity and extra high durability are required, concentration of group VIII metal is preferably in a range from 0.5% by weight to 9.5% by weight. Moreover, for the maximum durability, concentration of group VIII metal is preferably in a range from 2% by weight to 8% by weight.

When concentration of group Ib metal is less than 85% by weight, it leads to a high specific resistance of the internal electrode 12, resulting in heat generated by the internal electrodes 12 when the multi-layer piezoelectric element is operated continuously. In order to prevent group Ib metal included in the internal electrode 12 from diffusing into the piezoelectric material 11, concentration of group Ib metal is preferably in a range from 85% by weight to 99.999% by weight. In view of higher durability of the multi-layer piezoelectric element, concentration of group Ib metal is preferably in a range from 90% by weight to 99.9% by weight. When extra high durability is required, concentration of group Ib metal is preferably in a range from 90.5% by weight to 99.5% by weight. Moreover, for the maximum durability, concentration of group Ib metal is preferably in a range from 92% by weight to 98% by weight.

Concentrations by weight of group VIII metal and group Ib metal in the metal composition in the internal electrode 12 can be measured by EPMA (Electron Probe Micro Analysis) or the like.

It is preferable that the group VIII metal included in the metal composition in the internal electrode 12 of the present invention is at least one kind selected from among Ni, Pt, Pd, Rh, Ir, Ru and Os, and Ib metal is at least one kind selected from among Cu, Ag and Au, because such a composition can be favorably manufactured in mass production by the alloy powder manufacturing technology currently in practice.

It is more preferable that the group VIII metal included in the metal composition in the internal electrode 12 is at least one kind selected from among Pt and Pd, and Ib metal is at least one kind selected from among Ag and Au, because such a composition enables it to form the internal electrode 12 having excellent heat resistance and low specific resistance.

It is further preferable that the group VIII metal included in the metal composition in the internal electrode 12 is Ni, because such a composition enables it to form the internal electrode 12 having excellent heat resistance.

It is further preferable that the group Ib metal included in the metal composition in the internal electrode 12 is Cu, because such a composition enables it to form the internal electrode 12 having excellent heat conductivity.

Moreover, it is preferable that the internal electrode 12 includes an inorganic compound added to the metal composition. This enables strong bonding between the internal electrode 12 and the piezoelectric material 11. The inorganic compound preferably includes a perovskite type oxide constituted from $PbZrO_3$-$PbTiO_3$ as the main component.

In addition, the piezoelectric material 11 preferably includes a perovskite type oxide as the main component. When the piezoelectric material 11 is formed from a perovskite type piezoelectric ceramic material represented by barium titanate ($BaTiO_3$), for example, high piezoelectric strain constant $d_{33}$ that represents the piezoelectric characteristic of the material increases the amount of displacement and allows it to sinter the piezoelectric material 11 and the internal electrode 12 at the same time. The piezoelectric material 11 is preferably constituted from a material that includes perovskite type oxide constituted from $PbZrO_3$-$PbTiO_3$ that has relatively high value of high piezoelectric strain constant $d_{33}$ as the main component.

The piezoelectric material 11 is preferably sintered at a temperature in a range from 900 to 1000° C. This is because the material cannot be fully sintered at a temperature below 900° C., thus making it difficult to make the piezoelectric material 11 with high density. When the sintering temperature is higher than 1000° C., on the other hand, large stress is generated due to the difference in shrinkage between the internal electrode 12 and the piezoelectric material 11 when fired, thus resulting in cracks generated during continuous operation of the multi-layer piezoelectric element.

Change in the composition of the internal electrode 12 caused by firing is preferably not more than 5%. When the change in the composition of the internal electrode 12 caused by firing exceeds 5%, much metal composition in the internal electrode diffuses into the piezoelectric material 11 thus making it impossible for the internal electrode 12 to accommodate the contraction and expansion of the multi-layer piezoelectric element during operation.

Change in the composition of the internal electrode 12 refers to a change in the composition of the internal electrode 12 caused by evaporation of the metal composition that constitutes the internal electrode 12 during firing or diffusion thereof into the piezoelectric material 11.

In the multi-layer piezoelectric element of the second embodiment, one end of the internal electrode is exposed on the side face of the stack alternately at every other layer while the other end of the internal electrode is located inside from one side face. It is preferable that a groove is formed toward the end that is located inside and the groove is filled with a dielectric material of which Young's modulus is lower than that of the piezoelectric material. This constitution enables it to mitigate the stress generated by the displacement of the multi-layer piezoelectric element during operation, so that heat generation from the internal electrode 12 can be suppressed during continuous operation.

Now the method for manufacturing the multi-layer piezoelectric element of the present invention will be described.

Calcinated powder of piezoelectric ceramic material constituted from perovskite type oxide such as $PbZrO_3$-$PbTiO_3$, a binder made of an organic polymer such as acrylic resin or butyral resin and a plasticizer such as DBP (dibutyl phthalate) or DOP (dioctyl phthalate) are mixed to form a slurry which is formed into a ceramic green sheet that would become the piezoelectric material 11 by a known method such as doctor blade process or tape molding method such as calender roll process.

Then a metal oxide such as silver oxide, a binder and a plasticizer are mixed with the metal composition that constitutes the internal electrode 12 such as silver-palladium alloy to prepare an electrically conductive paste which is applied onto the top surface of the ceramic green sheet by screen printing or the like to a thickness of 1 to 40 μm.

A plurality of the green sheets having the electrically conductive paste printed thereon are stacked one on another, with the stack being heated at a predetermined temperature to remove the binder and fired at a temperature in a range from 900 to 1200° C. thereby to make the stack 13.

At this time, a dense stack can be made by adding metal powder that constitutes the internal electrode such as silver-palladium alloy in the green sheet in the portion of the inactive layer 14, or printing a slurry consisting of the metal powder that constitutes in the internal electrode such as silver-palladium alloy, an inorganic compound, a binder and a plasticizer onto the green sheets, which enables it to match the inactive layer 14 and the other portions in the behavior of shrinking and the shrinking ratio during the sintering process.

The method of making the stack 13 is not limited to that described above, and any manufacturing method may be employed as long as the stack 13 can be made in such a constitution as a plurality of the piezoelectric layers 11 and a plurality of the internal electrodes 12 are stacked alternately one on another.

Then the internal electrode 12 of which one end is exposed on the side face of the multi-layer piezoelectric element and the internal electrode 12 of which one end is not exposed are formed alternately, and a groove is formed in the portion of the piezoelectric material located between the internal electrode 12 of which one end is not exposed and the external electrodes 15, with the groove being filled with a dielectric material such as resin or rubber of which Young's modulus is lower than that of the piezoelectric material 11. The groove is formed on the side face of the stack 13 by means of a dicing apparatus or the like.

The electrically conductive material that constitutes the external electrode 15 is preferably silver or an alloy based on silver that has a low value of Young's modulus, so as to absorb the stress generated by the contraction and expansion of the actuator.

The external electrode 15 may be formed as follows. An electrically conductive silver-glass paste is prepared by adding a binder to a glass powder and formed into a sheet that is dried to remove solvent while controlling the density of the sheet in a range from 6 to 9 $g/cm^3$. The sheet is transferred onto the external electrode forming surface of the column-like stack 13, and is baked at a temperature that is higher than the softening point of the glass and is not higher than the melting point (965° C.) of silver and is ⅘ of the firing temperature (° C.) or lower. In this process, the binder included in the sheet formed from the electrically conductive silver-glass paste is removed and the external electrode 15 is formed from a porous electrical conductor having 3-dimensional mesh structure.

The temperature at which the electrically conductive silver-glass paste is baked is preferably in a range from 550 to 700° C. for the purpose of effectively forming a neck, joining silver that is included in the electrically conductive silver-glass paste and the internal electrode 12 through diffusion, effectively causing the voids in the external electrode 15 to remain and partially joining the external electrode 15 and the side face of the column-like stack 13. Softening point of the glass component included in the electrically conductive silver-glass paste is preferably in a range from 500 to 700° C.

When the baking temperature is higher than 700° C., sintering of the silver powder of the electrically conductive silver-glass paste proceeds excessively, such that the porous electrical conductor of 3-dimensional mesh structure cannot be effectively formed. That is, the external electrode 15 becomes too dense, resulting in Young's modulus of the external electrode 15 that is too high to effectively absorb the stress generated during operation, eventually leading to breakage of the external electrode 15. Baking is preferably carried out at a temperature that is not higher than 1.2 times the softening point of the glass.

When the baking temperature is lower than 550° C., end of the internal electrode 12 and the external electrode 15 cannot be joined sufficiently through diffusion, and therefore the neck cannot be formed thus resulting in spark occurring between the internal electrode 12 and the external electrode 15 during operation.

Thickness of the sheet formed from the electrically conductive silver-glass paste is preferably smaller than the thickness of the piezoelectric layer 11. More preferably, the thickness is 50 μm or less in order to accommodate the contraction and expansion of the actuator.

Then the stack 13 in which the external electrode 15 is formed is immersed in a silicone rubber solution while deaerating the silicone rubber solution by evacuation, so as to fill the groove of the stack 13 with the silicone rubber. The stack 13 is pulled out of the silicone rubber solution and is coated with the silicone rubber on the side faces thereof. Then the silicon rubber that fills the groove and covers the side faces of the column-like stack 13 is hardened thereby completing the multi-layer piezoelectric element of the present invention.

Lead wires are connected to the external electrodes 15, a DC voltage of 0.1 to 3 kV/mm is applied between the pair of external electrodes 15 via the lead wires so as to apply polarization treatment to the stack 13, thereby to complete the multi-layer piezoelectric actuator comprising the multi-layer piezoelectric element of the present invention. When the lead wires are connected to an external voltage source and the voltage is supplied via the lead wires and the external electrodes 15 to the internal electrodes 12, the piezoelectric layers 11 of the multi-layer piezoelectric element of the present invention undergoes a significant amount of displacement by the reverse piezoelectric effect, so as to drive, for example, an automobile fuel injection valve that supplies fuel to the engine.

An electrical conductivity assisting member made of an electrically conductive adhesive with a metal mesh or a mesh-like metal sheet embedded therein may be formed on the external surface of the external electrode 15. In this case, the electrical conductivity assisting member provided on the external surface of the external electrode 15 allows it to supply a large electric current to the actuator, thereby enabling it to draw a large current through the electrical conductivity assisting member even when operated at a high speed, thus reducing the current flowing in the external electrode 15. This makes it possible to prevent the external electrodes 15 from breaking due to localized heat generation, thus resulting in greatly improved reliability. Moreover, because the metal mesh or the mesh-like metal sheet is embedded in the electrically conductive adhesive, cracks can be prevented from occurring in the electrically conductive adhesive.

The metal mesh refers to a structure of entwined metal wires, and the mesh-like metal sheet refers to a metal sheet with a number of holes punched therethrough.

It is also preferable that the electrically conductive adhesive that constitutes the electrical conductivity assisting member is formed from polyimide resin including silver powder dispersed therein. By dispersing the silver powder that has low specific resistance in the polyimide resin that has high heat resistance, the electrical conductivity assisting member can maintain low resistivity and high bonding strength even when used at high temperatures. More preferably, the electrically conductive particles are non-spherical particles such as flakes or acicular particles. When the electrically conductive particles are non-spherical particles such as flakes or acicular particles, the electrically conductive particles can be firmly entwined with each other, thereby increasing the shear strength of the electrically conductive adhesive.

The multi-layer piezoelectric element of the present invention is not limited to the constitution of the second embodiment described above, and various modifications can be made to an extent that does not deviate from the scope of the present invention.

While an example where the external electrodes 15 are formed on the opposing side faces of the stack 13 has been described above, a pair of external electrodes may be formed on, for example, adjacent side faces according to the present invention.

Figure 8:
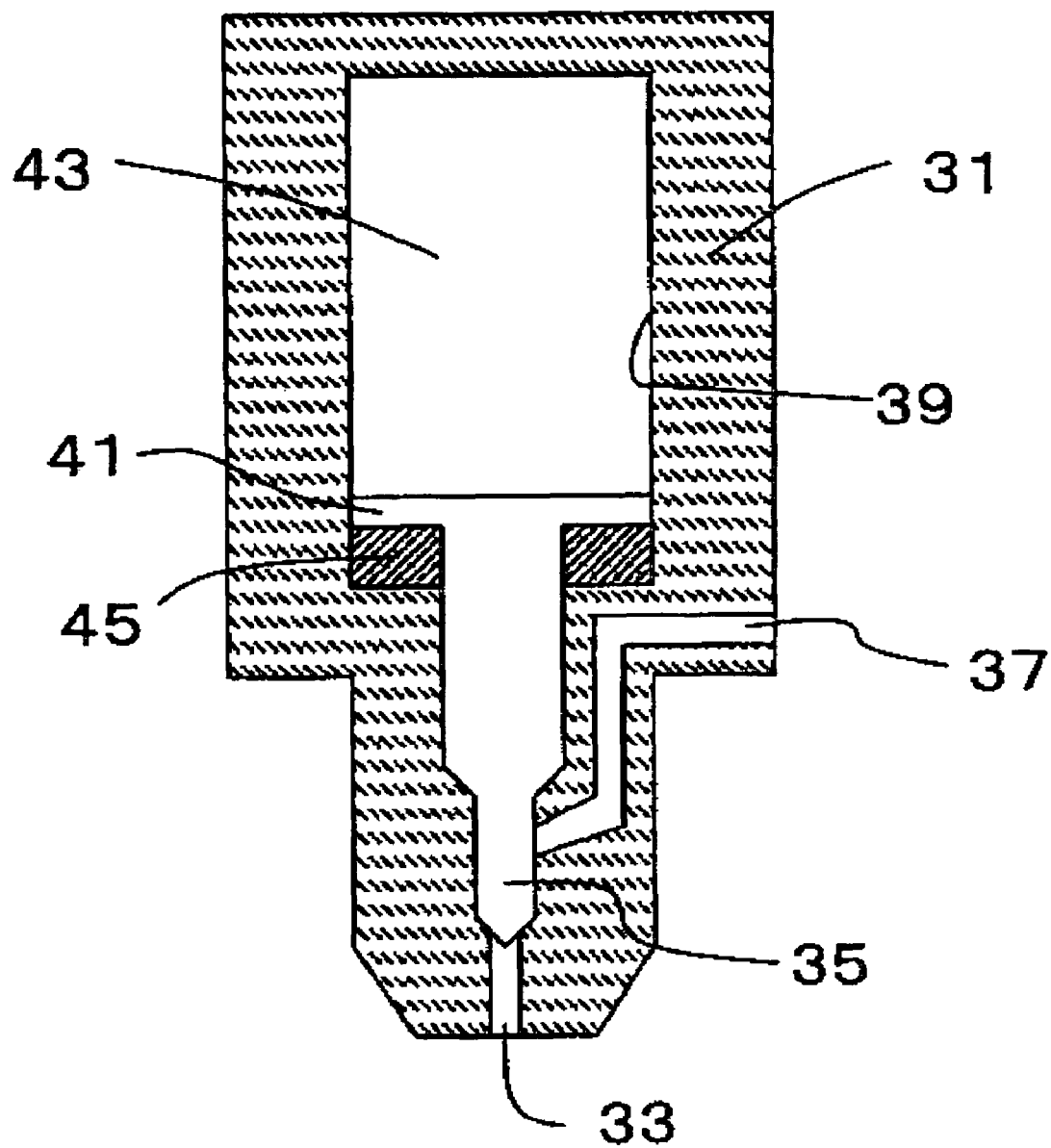
FIG. 8 is a sectional view showing the constitution of an injection apparatus of the present invention.

FIG. 8 shows the injection apparatus according to the present invention, where an injection hole 33 is provided on one end of a container 31 and a needle valve 35 that can open and close the injection hole 33 is housed in the container 31.

A fuel passage 37 is provided so as to be capable of communicating with the injection hole 33, and is connected to a fuel source that is provided outside of the apparatus, so as to supply the fuel through the fuel passage 37 at a high pressure that is maintained constant. When the needle valve 35 opens the injection hole 33, the fuel supplied to the fuel passage 37 is injected into a fuel chamber (not shown) of an internal combustion engine at a high pressure that is maintained constant.

Diameter of the needle valve 35 is made larger at the top end to become a piston 41 that is movable while sliding in a cylinder 39 formed in the container 31. The piezoelectric actuator 43 is housed in the container 31.

In the injection apparatus having the constitution described above, when the piezoelectric actuator 43 expands under a voltage applied thereto, the piston 41 is pressed so that the needle valve 35 closes the injection hole 33 thereby stopping the fuel supply. When application of the voltage is stopped, piezoelectric actuator 43 contracts and a belleville spring pushes back the piston 41 so that the injection hole 33 communicates with the fuel passage 37 and the fuel is injected.

While FIG. 8 relates to the multi-layer piezoelectric element and the injection apparatus, the present invention is not limited to the constitution shown in FIG. 8. For example, the present invention can be applied to a fuel injection apparatus of automobile engine, liquid ejecting apparatus of ink jet printer or the like or a drive unit used in precision positioning device or vibration preventing device for an optical apparatus, or to sensor devices such as a sensor element mounted in combustion pressure sensor, knocking sensor, acceleration sensor, load sensor, ultrasonic sensor, pressure sensor, yaw rate sensor or the like, or used as a circuit component mounted in piezoelectric gyro, piezoelectric switch, piezoelectric transformer, piezoelectric breaker or the like, and is also applicable to other purposes, as long as the piezoelectric characteristic is utilized.

Third Embodiment

The piezoelectric electronic component according to the third embodiment of the present invention is a multi-layer piezoelectric actuator of similar constitution as that of the first embodiment, with a part of the manufacturing process different from that of the first embodiment.

Figure 9:
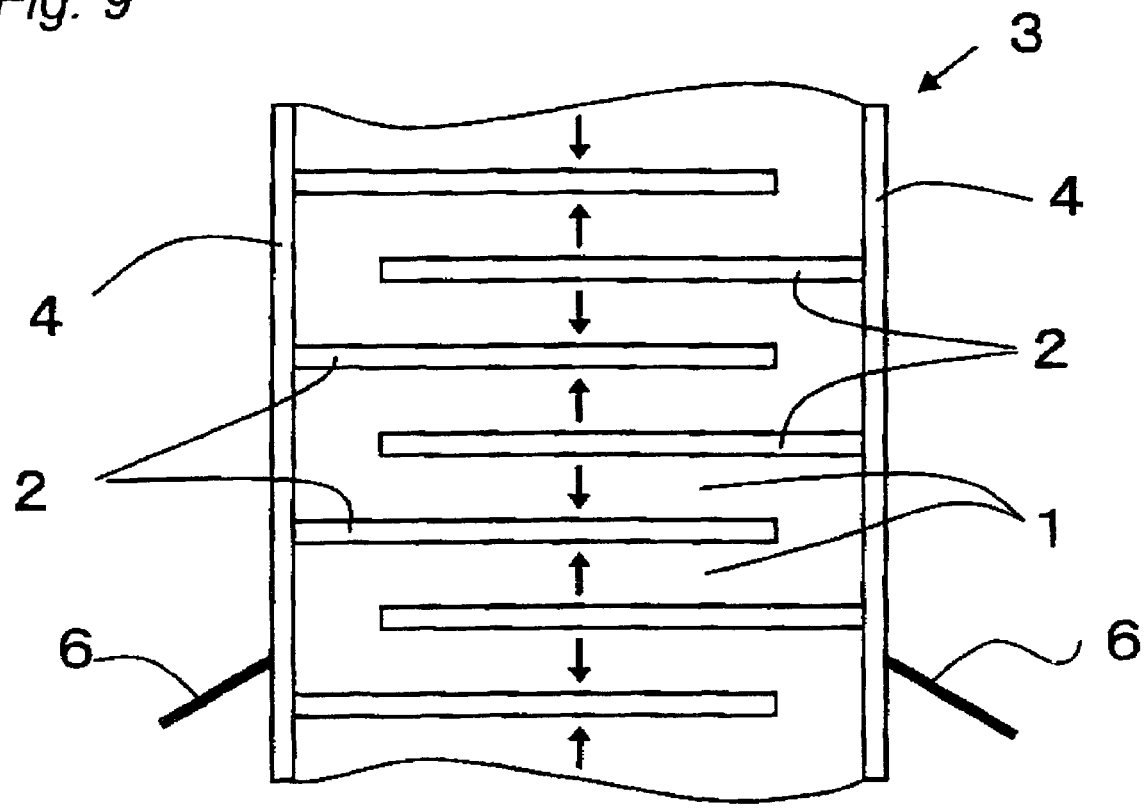
FIG. 9 is a partial sectional view of a multi-layer piezoelectric element according to the third embodiment of the present invention.

FIG. 9 is an enlarged sectional view of a part of the multi-layer piezoelectric actuator of the third embodiment, with similar components identified with similar reference numerals as in the first embodiment.

Thickness of the piezoelectric layer 1, namely the distance between the internal electrodes 2, is preferably not larger than 200 μm, or more preferably not larger than 150 μm, in order to make the construction smaller and apply high electric field. On the other hand, thickness of the piezoelectric layer 1 is set not smaller than 50 μm, preferably not smaller than 70 μm, in order to reduce the transient time of applying a voltage to the piezoelectric layer 1 and enable faster response. Thus the number of stacked layers is preferably 200 or more. While larger displacement of the multi-layer piezoelectric element under a given voltage is achieved by stacking a larger number of piezoelectric layers, stacking a larger number of thick piezoelectric layers 1 in the multi-layer piezoelectric body 3 makes it impossible to make an actuator of smaller size and lower profile. On the other hand, insulation breakdown may be caused when thickness of the piezoelectric layers 1 in the multi-layer piezoelectric body 3 is too small. Therefore, the thickness is preferably in the range described above.

Average crystal grain size of crystal grains that constitute the piezoelectric material according to the third embodiment is preferably 5 µm or less, and more preferably 3 µm or less.

In the multi-layer piezoelectric element of the first embodiment, it is important that change in the degree of orientation f of the crystal grains of the piezoelectric material is controlled to within 5% after operation, by employing the manufacturing method described below. In order to enable continuous operation of more than $10^9$ cycles, degree of orientation f is preferably controlled to within 3%. An injection apparatus of high reliability can be made by employing the multi-layer piezoelectric element that is capable of repetitive operations of more than $10^9$ cycles under such conditions as load of 150 kgf, temperature of 150° C. and frequency of 50 Hz.

When change in the degree of orientation f of the crystal grains of the piezoelectric material exceeds 5% after operation, constant piezoelectric characteristic cannot be obtained during continuous operation and, moreover, service life becomes shorter.

Figure 10A:
FIGS. 10A through 10C show processes for manufacturing the multi-layer piezoelectric element of the third embodiment.
Figure 10B:
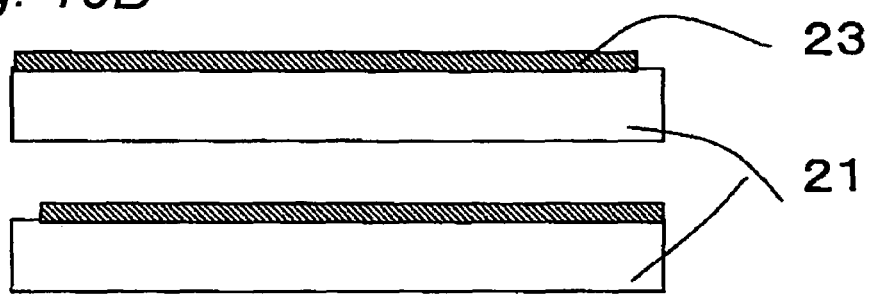
Figure 10C:
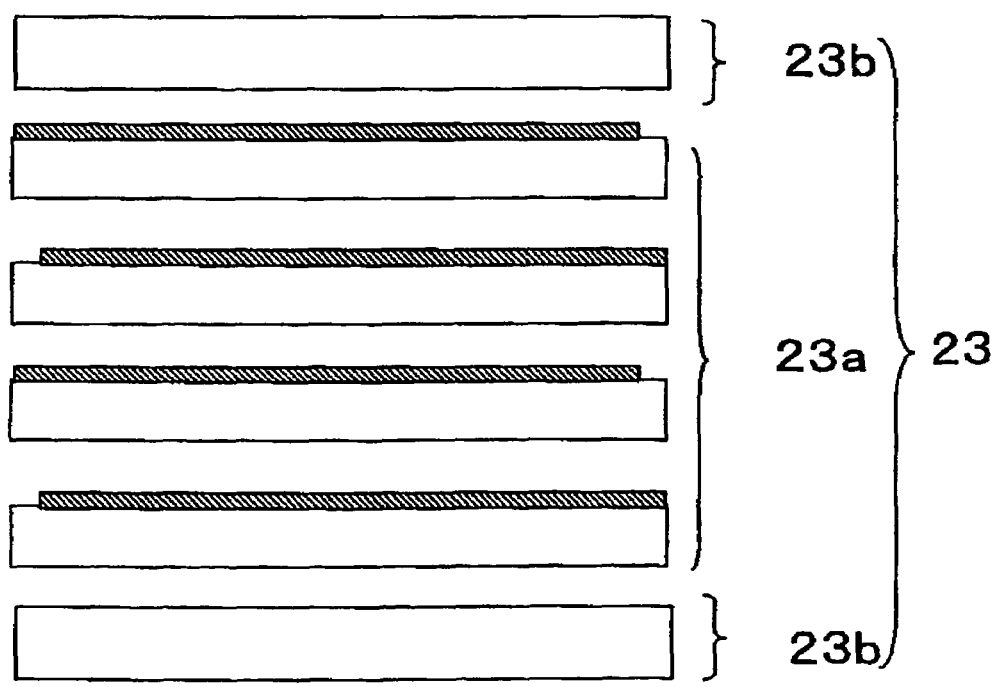

FIG. 10 is a flow chart showing the sequence of processes to manufacture the multi-layer piezoelectric element of the present invention. The manufacturing method will now be described below taking a multi-layer piezoelectric actuator as a representative example of the multi-layer piezoelectric element of the third embodiment.

In the manufacturing method for the multi-layer piezoelectric element of the third embodiment, for example, a ceramic green sheet 21 having thickness in a range from 50 to 250 µm is made similarly to the first embodiment (FIG. 10A).

In the manufacturing method according to the third embodiment, preferable range of the average particle size of the piezoelectric powder that is calcinated powder that makes the piezoelectric layer 1 and preferable range of thickness of the green sheet 21 are similar to those of the first embodiment.

A conductor pattern 22 is formed on one side of the green sheet 21 that has been punched through to predetermined dimensions similarly to the first embodiment. In this case, it is preferable to mix a ceramic powder in the electrically conductive paste similarly to the second embodiment.

Then a multi-layer piezoelectric green compact 23 is made similarly to the first embodiment and is cut into predetermined dimensions, before being degreased in air atmosphere and fired so as to make the multi-layer piezoelectric stack 3.

In the third embodiment, firing is carried out preferably at a temperature not higher than 1000° C., especially at 980° C. or lower in order to increase the proportion of Ag in the internal electrode 2 and reduce the manufacturing cost.

Then similarly to the first embodiment, the external electrode paste that includes Ag-glass is applied to the end face of the piezoelectric stack 3, and is heated at a temperature in a range from 500° C. to 900° C., so as to form the external electrode 4 shown in FIG. 10. In this case, cooling rate from the maximum temperature of heat treatment is preferably in the same range as that of the first embodiment.

Figure 11:
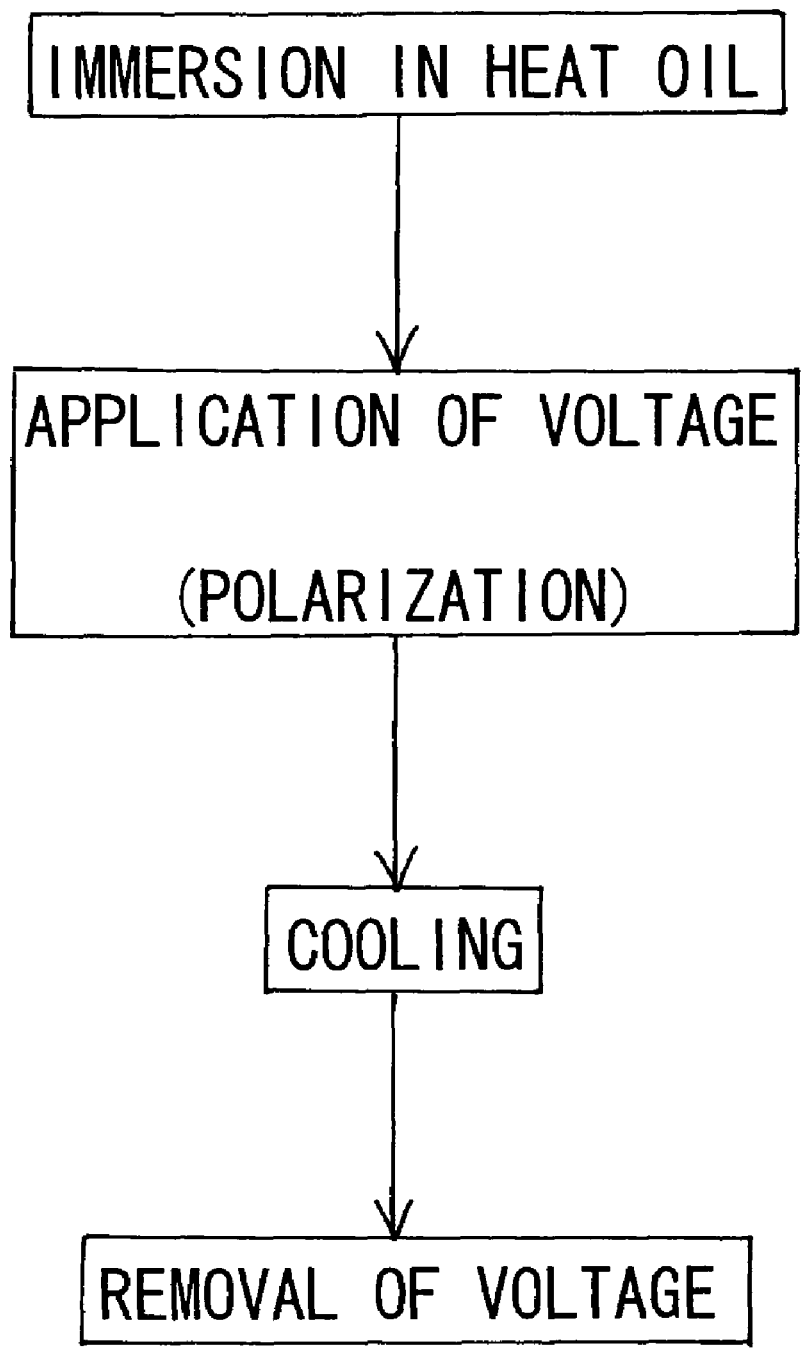
FIG. 11 is a flow chart showing the sequence of polarization treatment processes according to the third embodiment.

The multi-layer piezoelectric element made as described above is subjected to polarization treatment according to the procedure shown in FIG. 11.

Specifically, the multi-layer piezoelectric element is immersed in an oil bath that is heated to a temperature from 100° C. to 400° C., and a DC voltage of 0.1 to 3 kV/mm is applied between a pair of the external electrodes 4 that are formed on the device so as to fully polarize the crystal grains that constitute the piezoelectric layer.

After the polarization treatment, the device is cooled down to room temperature below Curie temperature while maintaining the applied voltage. Then after cooling down to the room temperature, electric field is reduced. With this polarization treatment, the multi-layer piezoelectric element of the third embodiment is completed.

It is important to apply the polarization treatment to the multi-layer piezoelectric element of the third embodiment in the procedure described above.

When the internal electrode 2 includes Ag, for example, Ag normally diffuses toward the piezoelectric layer during firing. When Ag diffuses, oxygen defects are formed in the porcelain due to mutual diffusion with the porcelain of the piezoelectric layer. The oxygen defects become oxygen hole ions during continuous operation, affecting the moving direction of ions at B site (Zr, Ti) constituting the piezoelectric layer, so that the preferred orientation of the porcelain changes with time. According to the present invention, in contrast, sufficient polarization is carried out under the conditions described above, and therefore the change in preferred orientation of the porcelain with time is suppressed.

According to the third embodiment, the rate of cooling down after the polarization treatment is preferably set to t/3 (° C./minute) or less, where t (° C.) is Curie temperature of the piezoelectric layer. Such a cooling rate enables it to more effectively suppress the piezoelectric characteristic from changing after operation.

The change in the ratio of lattice constants c/a of the piezoelectric material that constitutes the piezoelectric layer after polarization is preferably 0.5% or less. This is because, when the change in c/a is larger than 0.5%, stress generated during polarization causes peel-off between the internal electrode 2 and the piezoelectric layer 1. In the third embodiment, in order to effectively prevent peel-off due to polarization from occurring, change in c/a is more preferably 0.2% or less. The ratio of lattice constants c/a is determined by calculating the lattice constant a from a peak of plane (200) from XRD diffraction pattern and calculating the lattice constant c from a peak of plane (002).

In the third embodiment, it is made possible to control the change in the preferred orientation of the crystal grains that constitutes the piezoelectric layer 1 after operation to within 5% by employing the manufacturing method described above.

The method of manufacturing the multi-layer electronic component of the third embodiment is preferably used in the manufacture of multi-layer electronic component such as multi-layer piezoelectric transformer, multi-layer capacitor or multi-layer piezoelectric actuator. The method of manufacturing the multi-layer electronic component of the present invention is particularly preferable or the manufacture of multi-layer piezoelectric actuator formed from piezoelectric ceramics that is continuously operated by applying high electric field. Operation test is preferably carried out by conducting repetitive operations of more than $10^9$ cycles under such conditions as load of 150 kgf, temperature of 150° C. and frequency of 50 Hz.

An injection apparatus similar to that described in the second embodiment can be made by using the multi-layer piezoelectric element of the third embodiment that has the constitution described above.

While the third embodiment has been described by way of an example where the internal electrode 2 is made of Ag—Pd, the present invention is not limited to this constitution and the internal electrode 2 may be formed by using various materials.

However, the metal composition that constitutes the internal electrode 2 preferably consists of either the group VIII metal or the group Ib metal, or both the group VIII metal and the group Ib metal as the main component. Particularly, proportion M1 (% by weight) of the group VIII metal and proportion M2 of the group Ib metal preferably satisfy the relations $0.001 \leq M1 \leq 15$, $85 \leq M2 \leq 99.999$ and $M1+M2=100$, more preferably $3 \leq M1 \leq 8$ and $92 \leq M2 \leq 97$.

It is preferable that the group VIII metal is at least one kind selected from among Ni, Pt, Pd, Rh, Ir, Ru and Os, and the group Ib metal is at least one kind selected from among Cu, Ag and Au. It is more preferable that the group VIII metal is at least one kind selected from among Pt and Pd, and the group Ib metal is at least one kind selected from among Ag and Au. It is furthermore preferable that the group VIII metal is Ni, the group Ib metal is Cu.

Thickness of the internal electrode of the present invention is preferably 5 µm or less, and more preferably 4 µm or less.

The internal electrode 2 of the present invention includes an inorganic component, and the inorganic component is preferably the same as that of the piezoelectric layer 1 and has average particle size smaller than that of the piezoelectric layer 1.

EXAMPLE 1

In Example 1, the multi-layer electronic component of the first embodiment shown in FIG. 1 was made and was evaluated for the size of the gap between the internal electrode and the ceramic layer.

First, a slurry was prepared by mixing a calcinated powder of piezoelectric ceramics such as lead zirconate titanate Pb(Zr, Ti)O$_3$ having Curie temperature of 300° C. and particle size of 0.7 µm, an organic binder made of butyral resin and a plasticizer, and the slurry was formed into a ceramic green sheet 21 having thickness of 150 µm by slip casting method.

Then an electrically conductive paste, that includes silver-palladium alloy which makes the internal electrode 2 and a solvent, is applied to one side of the ceramic green sheet 21 to a thickness of 4 µm as shown in FIG. 2 by screen printing process, so as to form the internal conductor pattern 22.

Then 30 pieces of the ceramic green sheets 21 whereon the internal conductor pattern 22 was formed were stacked. Then 5 pieces of the ceramic green sheet 21 without electrically conductive paste printed thereon were stacked on the top and bottom surfaces of the stack, thereby making the multi-layer green compact 23 having the construction shown in FIG. 3.

The multi-layer green compact 23 was put into a die and was heated to 90° C. while applying pressure of 100 MPa by means of an isostatic press so as to be integrated.

The multi-layer green compact 23 that was integrated was cut into 10 mm square and was heated to 800° C. for 10 hours to remove the binder, followed by firing at 1130° C. for 2 hours, thereby to obtain the column-like stack 3.

Ag-glass paste including Ag as the main component was applied to a pair of opposing side faces of the active section and was heated at 750° C. for 1 hour before being cooled down at the rate shown in Table 1 thereby to form the external electrode 4.

Then a DC voltage of 3 kV/mm was applied between the positive and negative external electrodes 4 so as to apply polarization treatment for 15 minutes, thereby to make the multi-layer piezoelectric element. The change in ratio of lattice constants c/a after the polarization is shown in Table 1.

TABLE 1

| No | Cooling rate (° C./minute) | Change in c/a (%) | Gap in interface µm | Proportion of area with distance 2 µm or less % | Delamination |
|---|---|---|---|---|---|
| *1-1 | 150 Curie temperature/2 | 0.60 | 2.8 | 5 | Occurred |
| 1-2 | 100 Curie temperature/3 | 0.45 | 1.6 | 52 | No |
| 1-3 | 50 Curie temperature/6 | 0.20 | 1.0 | 71 | No |
| 1-4 | 10 Curie temperature/30 | 0.05 | 0.3 | 86 | No |
| 1-5 | 5 Curie temperature/60 | 0.05 | 0.3 | 98 | No |

As shown in Table 1, samples Nos. 1-2 through 1-5 within the scope of the present invention showed no delamination in the interface, as the internal electrode and the piezoelectric layer are located near to each other with distance not larger than 2 µm in 50% or more of the active region where two adjacent internal electrodes oppose each other. In sample No. 1-1 that was made by cooling down at a rate out of the scope of the present invention, in contrast, since the gap is as large as 2.8 µm in the interface and the proportion of area where the gap is 2 µm or less is only 5% due to the fast cooling rate, occurrence of delamination was confirmed by observation of the appearance with a binocular microscope.

EXAMPLE 2

In Example 2, the multi-layer piezoelectric actuator of the second embodiment was made and was evaluated as described below.

First, a slurry was prepared by mixing a calcinated powder of piezoelectric ceramics including lead zirconate titanate (PbZrO$_3$—PbTiO$_3$) having average particle size of 0.4 µm as the main component, a binder and a plasticizer, and the slurry was formed into a ceramic green sheet that would become the piezoelectric layer 11 having thickness of 150 µm by doctor blade method.

Then an electrically conductive paste was applied to one side of the ceramic green sheet to a thickness of 3 µm by screen printing process. Then 300 pieces of the ceramic green sheets were stacked and fired at 1000° C. after hold the temperature at 800° C. The electrically conductive paste was made by adding silver oxide and a binder to the silver-palladium alloy, and the proportion of the silver-palladium alloy can be determined arbitrarily.

After firing, a groove measuring 50 µm in depth and 50 µm in width was formed at the end of the internal electrode located on the side face of the stack in every other layer, by means of a dicing apparatus.

Then 90% by volume of silver powder of flake-like particle shape having average particle size of 2 µm and 10% by volume of amorphous glass powder having softening point of 640° C. including silicon as the main component having average particle size of 2 µm were mixed, and 8 parts by weight of a binder is added for 100 parts by weight in total of the silver powder and the glass powder, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste. Density of the green sheet as measured by Archimedes method was 6.5 g/cm$^3$.

The sheet of the electrically conductive silver-glass paste was transferred onto the surface of the external electrode 15 of the stack 13, and was baked at 650° C. for 30 minutes so as to form the external electrode 15 made of a porous electrically conductive material having 3-dimensional mesh structure. Void ratio of the external electrode 15 measured by analyzing a photograph of a cross section of the external electrode 15 with an image analyzer was 40%.

Lead wires were connected to the external electrodes 15, and a DC electric field of 3 kV/mm was applied via the lead wires between the positive and negative external electrodes 15 so as to apply polarization treatment for 15 minutes, thereby to make the multi-layer piezoelectric actuator comprising the multi-layer piezoelectric element shown in FIG. 1.

When a DC voltage of 170 V was applied across the multi-layer piezoelectric element obtained as described above, the multi-layer piezoelectric element underwent displacement of 45 μm in the stacking direction. The multi-layer piezoelectric element was then subjected to an AC voltage varying between 0 V and +170 V at frequency of 150 Hz for operation test at the room temperature.

The multi-layer piezoelectric element shown in Tables 2 and 3 that were operated for $1 \times 10^9$ cycles were cut into pieces measuring 3 mm×4 mm×36 mm, that were tested for bending strength by 4-point bending test according to JIS R1601. When the electrode surface of the internal electrode 12 was disposed substantially at right angles to the longitudinal direction of the test piece, all test pieces fractured in the interface between the internal electrode 12 and the piezoelectric layer 11.

The samples shown in Table 2 were observed with SEM to measure the average crystal grain size of the piezoelectric layer 11 in a portion making contact with the internal electrode 12 and the average crystal grain size of other portion, so as to investigate the relationship between the average crystal grain size and the bending strength. Specifically, the average crystal grain size was measured by drawing a straight line over the image of the piezoelectric grains that face the internal electrode captured by the SEM, measuring the length of line segment enclosed within the boundary of each of randomly selected 50 crystal grains and averaging the measurements.

The average crystal grain size in the other portion was determined by drawing a straight line at an arbitrary position of the image in a region other than the piezoelectric layer that faces the internal electrode and measuring the length of line segment enclosed within the boundary of each of randomly selected 50 crystal grains and averaging the measurements.

The minimum crystal grain size is defined as the smallest grain size among the crystal grains shown in the same area of the image where the average crystal grain size was measured.

For the purpose of comparison, relationship between the average crystal grain size and the bending strength was also investigated when average crystal grain size of the piezoelectric layer 11 of a portion making contact with the internal electrode 12 was made the same as or larger than the average crystal grain size of other portion by the conventional manufacturing method.

The samples shown in Table 3 were observed with SEM to measure the minimum crystal grain size and the maximum crystal grain size of the piezoelectric layer 11 of a portion that makes contact with the internal electrode 12, and the minimum crystal grain size and the maximum crystal grain size of the other portion, so as to investigate the relationship between these values and the bending strength. The measuring method was similar to that shown in Table 2. For the purpose of comparison, relationship between the minimum crystal grain size and the maximum crystal grain size and the bending strength was also investigated when the minimum crystal grain size and the maximum crystal grain size of the piezoelectric layer 11 of a portion making contact with the internal electrode 12 were made substantially the same as or larger than the minimum crystal grain size and the maximum crystal grain size of the other portion. The results are shown in Tables 2 and 3.

TABLE 2

| No | Average crystal grain size 1 (μm) | Average crystal grain size 2 (μm) | Bending strength (MPa) |
|---|---|---|---|
| *2-1 | 0.4 | 0.4 | 34.3 |
| 2-2 | 1.0 | 0.8 | 84.6 |
| 2-3 | 1.9 | 1.7 | 90.2 |
| 2-4 | 2.7 | 2.4 | 92.4 |
| 2-5 | 3.8 | 3.5 | 103.6 |
| 2-6 | 5.7 | 5.2 | 99.6 |
| 2-7 | 8.0 | 7.9 | 83.0 |
| *2-8 | 9.2 | 9.8 | 40.2 |

The average crystal grain size 1 shown in Table 2 represents the average crystal grain size (μm) of the piezoelectric layer in the vicinity of the internal electrode, and the average crystal grain size 2 represents the average crystal grain size (μm) of the piezoelectric layer in a portion other than the vicinity of the internal electrode.

TABLE 3

| No | Maximum crystal grain size 1 (μm) | Minimum crystal grain size 1 (μm) | Maximum crystal grain size 2 (μm) | Minimum crystal grain size 2 (μm) | Bending strength MPa |
|---|---|---|---|---|---|
| *2-9 | 1.2 | 0.1 | 1.3 | 0.2 | 34.3 |
| 2-10 | 2.4 | 0.5 | 2.3 | 0.3 | 84.6 |
| 2-11 | 2.6 | 1.0 | 2.8 | 0.3 | 90.2 |
| 2-12 | 3.1 | 2.7 | 3.0 | 0.3 | 92.4 |
| 2-13 | 4.5 | 3.8 | 4.6 | 0.3 | 103.6 |
| 2-14 | 6.2 | 5.0 | 6.8 | 0.2 | 99.6 |
| 2-15 | 8.4 | 4.6 | 8.1 | 0.4 | 83.0 |
| *2-16 | 10.1 | 5.0 | 11.2 | 5.2 | 40.2 |

The maximum crystal grain size 1 shown in Table 3 represents the maximum crystal grain size (μm) of the piezoelectric layer in the vicinity of the internal electrode, and the minimum crystal grain size 1 represents the minimum crystal grain size (μm) of the piezoelectric layer in the vicinity of the internal electrode.

The maximum crystal grain size 2 shown in Table 3 represents the maximum crystal grain size (μm) of the piezoelectric layer in a portion other than the vicinity of the internal electrode, and the minimum crystal grain size 2 represents the minimum crystal grain size (μm) of the piezoelectric layer in a portion other than the vicinity of the internal electrode.

From Table 2, it can be seen that sufficient bending strength cannot be obtained when the average crystal grain size of the piezoelectric layer 11 of a portion facing the internal electrode 12 is smaller than or the same as the average crystal grain size of the other portion (samples Nos. 2-1, 2-8), while bending strength can be improved when the average crystal grain size of the piezoelectric layer 11 of a portion facing the internal electrode 12 is larger than the average crystal grain size of the other portion (samples Nos. 2-2 through 2-7).

From Table 3, it can be seen that the maximum crystal grain size of the piezoelectric layer 11 of a portion facing the internal electrode 12 is the same as or larger than the maximum crystal grain size of the other portion. However, when the minimum crystal grain size is compared, it can be seen that sufficient bending strength cannot be obtained when the minimum crystal grain size of the piezoelectric layer 11 of a portion facing the internal electrode 12 was smaller than minimum crystal grain size of the other portion (samples Nos. 2-9, 2-16), while bending strength can be improved when the minimum crystal grain size of the piezoelectric layer 11 of a portion facing the internal electrode 12 is larger than the minimum crystal grain size of the other portion (samples Nos. 2-10 through 2-14).

From Table 3, it can also be seen that bending strength can be improved by setting the minimum crystal grain size of the piezoelectric layer 11 facing the internal electrode 12 in a range from 0.5 to 5 μm.

In any case, since all test pieces fractured in the interface between the internal electrode 12 and the piezoelectric layer 11, it can be seen that bonding strength in the interface between the internal electrode 12 and the piezoelectric layer 11 can be improved by making the crystal grain size (average crystal grain size, minimum crystal grain size) of the piezoelectric layer 11 of a portion facing the internal electrode 12 larger than the crystal grain size (average crystal grain size, minimum crystal grain size) of the other portion.

EXAMPLE 3

As Example 3 related to the second embodiment, multi-layer piezoelectric elements having different compositions of the internal electrode 12 were made and evaluated for the relation with the bending strength by measuring the minimum crystal grain size and the maximum crystal grain size of the piezoelectric layer making contact with the electrode, and measuring the minimum crystal grain size and the maximum crystal grain size of the other portion under the same conditions as those of Example 2. The results are shown in Table 4. Change in the amount of displacement was also measured on each test piece. Change in the amount of displacement is the decrease in displacement of the multi-layer piezoelectric element determined by comparing the displacement (μm) of the multi-layer piezoelectric element after undergoing $1 \times 10^9$ cycles of operation and the initial displacement (μm) of the multi-layer piezoelectric element before the continuous operation. The results are also shown in Table 4.

TABLE 4

| No | Pd content (% by weight) | Pt content (% by weight) | Ag content (% by weight) | Content of other metals in internal electrode (% by weight) |
|---|---|---|---|---|
| 3-17 | 0 | 0 | 100 | 0 |
| 3-18 | 0.001 | 0 | 99.999 | 0 |
| 3-19 | 0.01 | 0 | 99.99 | 0 |
| 3-20 | 0.1 | 0 | 99.9 | 0 |
| 3-21 | 0.5 | 0 | 99.5 | 0 |
| 3-22 | 1 | 0 | 99 | 0 |
| 3-23 | 2 | 0 | 98 | 0 |
| 3-24 | 4 | 1 | 95 | 0 |
| 3-25 | 5 | 0 | 95 | 0 |
| 3-26 | 8 | 0 | 92 | 0 |
| 3-27 | 9 | 0 | 91 | 0 |
| 3-28 | 9.5 | 0 | 90.5 | 0 |
| 3-29 | 10 | 0 | 90 | 0 |
| 3-30 | 15 | 0 | 85 | 0 |
| 3-31 | 20 | 0 | 80 | 0 |
| 3-32 | 30 | 0 | 70 | 0 |
| 3-33 | 0 | 0 | 0 | Cu 100% |
| 3-34 | 0.1 | 0 | 0 | Cu 99.9% |
| 3-35 | 0 | 0 | 0 | Ni 100% |

TABLE 4-continued

| No | Average grain size 1 (μm) | Average grain size 2 (μm) | Change in displacement (%) | Bending strength (MPa) |
|---|---|---|---|---|
| 3-17 | Fractured due to migration during operation. | | | — |
| 3-18 | 4.2 | 3.5 | 0.7 | 96.8 |
| 3-19 | 4.2 | 3.6 | 0.7 | 97.1 |
| 3-20 | 4.1 | 3.6 | 0.4 | 98.0 |
| 3-21 | 4.0 | 3.6 | 0.2 | 99.8 |
| 3-22 | 4.0 | 3.6 | 0.2 | 100.4 |
| 3-23 | 3.9 | 3.6 | 0 | 102.5 |
| 3-24 | 3.8 | 3.5 | 0 | 105.1 |
| 3-25 | 3.8 | 3.5 | 0 | 107.2 |
| 3-26 | 3.7 | 3.4 | 0 | 104.2 |
| 3-27 | 3.6 | 3.4 | 0.2 | 100.7 |
| 3-28 | 3.5 | 3.3 | 0.2 | 99.2 |
| 3-29 | 3.4 | 3.3 | 0.4 | 98.2 |
| 3-30 | 3.3 | 3.2 | 0.7 | 97.2 |
| 3-31 | 2.7 | 2.5 | 0.9 | 90.5 |
| 3-32 | 2.5 | 2.3 | 0.9 | 90.3 |
| 3-33 | 3.8 | 3.5 | 0.2 | 102.1 |
| 3-34 | 3.8 | 3.5 | 0 | 103.1 |
| 3-35 | 3.7 | 3.4 | 0.4 | 100.9 |

The average crystal grain size 1 shown in Table 4 represents the average grain size (μm) of the piezoelectric layer in the vicinity of the internal electrode, and the average crystal grain size 2 represents the average grain size (μm) of the piezoelectric layer in a portion other than the vicinity of the internal electrode.

Change in the amount of displacement shown in Table 4 is the difference between the initial displacement and the displacement after continuous operation test.

Table 4 shows that continuous operation became impossible as the multi-layer piezoelectric element broke due to silver migration, when the internal electrode 12 was made of 100% silver in sample No. 3-17. In samples other than No. 3-17, the average grain size of the piezoelectric layer 11 facing the internal electrode 12 was larger than the average crystal grain size of the piezoelectric layer 11 in the other portion. In samples Nos. 3-31 and 3-32, the content of the group VIII metal was higher than 15% by weight and the content of the group Ib metal was less than 85% by weight in the metal composition in the internal electrode 12, and therefore the multi-layer piezoelectric element deteriorates through continuous operation and durability of the multi-layer piezoelectric actuator decreases. Thus bending strength decreases in this case.

In samples Nos. 3-18 through 3-30 and 33 through 35, where the average grain size of the piezoelectric layer 11 facing the internal electrode 12 was larger than the average crystal grain size of the piezoelectric layer 11 in the other portion, and proportion M1 (% by weight) of the group VIII metal and proportion M2 of the group Ib metal in metal composition in the internal electrode preferably satisfy the relations $0 \leq M1 \leq 15$, $85 \leq M2 \leq 100$ and $M1+M2=100$, sufficient bending strength is achieved and the bonding strength between the internal electrode 12 and the piezoelectric layer 11 is improved, while specific resistance of the internal electrode 12 can be decreased so as to suppress the heat generation from the internal electrode 12 during continuous operation, thus making it possible to make the multi-layer piezoelectric actuator having stable displacement of the device.

The present invention is not limited to the examples described above, and various modifications can be made to an extent that does not deviate from the scope of the present invention.

EXAMPLE 4

Piezoelectric material powder constituted from lead zirconate titanate Pb(Zr, Ti)O$_3$, having Curie temperature of 300° C. and particle size of 0.7 μm, an organic binder made of butyral resin and a plasticizer were mixed to form a slurry which was formed into a green sheet 150 μm thick by slip casting method.

An electrically conductive paste, that included metal powder having predetermined composition of Ag—Pd component which would make the internal electrode, an organic resin and a solvent, was applied to one side of the green sheet to a thickness of 4 μm as shown in FIG. 2 by screen printing process, so as to form the conductor pattern. Then 30 pieces of the ceramic green sheet whereon the conductor pattern was formed were stacked one on another. Then 5 pieces of the green sheet without electrically conductive paste printed thereon were stacked on the top and bottom surfaces of the stack, thereby making the multi-layer green compact having the construction shown in FIG. 2.

The multi-layer green compact was put into a die and was heated to 90° C. while applying a pressure of 100 MPa by means of an isostatic press so as to be integrated.

The multi-layer green compact that had been integrated was cut into 10 mm square and was heated to 800° C. for 10 hours to remove the binder, followed by firing at 1130° C. for 2 hours, thereby to obtain the piezoelectric stack. Thickness of the piezoelectric layer that constituted the piezoelectric stack was 120 μm and thickness of the internal electrode was 3 μm. The rate of cooling down from the maximum temperature was set to t/3 (° C./minute) during firing, where t (° C.) is Curie temperature.

Then Ag-glass paste including Ag as the main component was applied to a pair of opposing side faces of the active section and was heated at 750° C. for 1 hour before being cooled down at the rate shown in Table 5 thereby to complete the heat treatment and form the external electrode.

Then the stack was immersed in an oil bath heated to 400° C. and a DC voltage of 3 kV/mm was applied between a pair of external electrodes of this device for 1 hour so as to apply sufficient polarization treatment to the crystal grains that constituted the piezoelectric layer and, while maintaining the voltage applied thereto, was cooled down to the room temperature below Curie temperature, thereby to make the multi-layer piezoelectric element. Proportion of preferred orientation of the crystal grains was measured by X-ray diffraction method immediately after the polarization treatment and after continuous operation of 10$^9$ cycles. The change in the ratio of lattice constants c/a is shown in Table 5. Effective piezoelectric strain constant was evaluated by applying voltage of 0 to 200 V to a sample of the multi-layer piezoelectric element that was fastened onto a vibration-isolated test bench with a load of 150 kgf applied thereto in the stacking direction. Change in the length of the multi-layer piezoelectric element was measured and was divided by the number of stacked layers and the applied voltage. Curie temperature was determined by measuring the temperature characteristic of the capacitance of the piezoelectric porcelain. High-temperature durability test was conducted by using a thermostat and operating the device to undergo 10$^9$ cycles under conditions of load of 150 kgf applied thereto at temperature of 150° C. and frequency of 50 Hz.

Comparative example was made by applying the conventional polarization treatment to the multi-layer piezoelectric element described above. Crystal grain size was determined through observation under electron microscope.

TABLE 5

| No | Composition of internal electrode | Polarizing condition | Average grain size μm | Change in degree of orientation (%) | Effective piezoelectric strain constant d$_{33}$ pm/V | Curie temperature ° C. | High-temperature durability test 10$^{19}$ cycles |
|---|---|---|---|---|---|---|---|
| *4-1 | 95/5 | 2 | 2.5 | 7 | 880 | 331 | B |
| 4-2 | 95/5 | 1 | 2.0 | 3 | 870 | 330 | A |
| 4-3 | 95/5 | 1 | 2.5 | 4 | 880 | 330 | A |
| 4-4 | 95/5 | 1 | 3.0 | 5 | 890 | 330 | A |
| 4-5 | 85/15 | 1 | 2.5 | 4 | 910 | 330 | A |
| 4-6 | 90/10 | 1 | 2.5 | 4 | 900 | 331 | A |

Note)
A: Excellent, B: Good

Table 5 shows that samples Nos. 4-2 through 4-6 that were subjected to the polarization treatment according to the present invention and showed changes in the degree of orientation of crystal grains of the piezoelectric material not larger than 5% demonstrated satisfactory results in the operation test of the present invention with changes in displacement after continuous operation within 10%.

In sample No. 4-1, where the change in the degree of orientation was larger than 5% after operation, change in displacement after continuous operation exceeded 10% and reached 15%.

INDUSTRIAL APPLICABILITY

The present invention provides the multi-layer electronic component and the method for manufacturing the same that are capable of suppressing delamination from occurring between the ceramic layer and the internal electrode, so as to provide the multi-layer piezoelectric element and the injection apparatus that are excellent in durability.

The invention claimed is:

1. A multi-layer piezoelectric element comprising a stack formed by stacking piezoelectric layers and internal electrodes one on another alternately, wherein an average crystal grain size of a portion of the piezoelectric material that makes contact with the internal electrode is larger than an average crystal grain size of the other portion.

2. The multi-layer piezoelectric element according to claim 1;
    wherein a minimum crystal grain size of the portion that makes contact with the internal electrode is 0.5 μm or more and 5 μm or less.

3. The multi-layer piezoelectric element according to claim 1;
    wherein the internal electrode includes group VIII metal and/or group Ib metal as a main component.

4. The multi-layer piezoelectric element according to claim 3; the internal electrode including a group VIII metal and/or a group Ib metal as a main component, wherein proportion M1 (% by weight) of group VIII metal and proportion M2 of group Ib metal are set the relations of $0 \leq M1 \leq 15$, $85 \leq M2 \leq 100$ and $M1+M2=100$.

5. The multi-layer piezoelectric element according to claim 4;
    wherein the group VIII metal is at least one kind selected from the group consisting of Ni, Pt, Pd, Rh, Ir, Ru and Os, and Ib metal is at least one kind selected from the group consisting of Cu, Ag and Au.

6. The multi-layer piezoelectric element according to claim 5;
    wherein the group VIII metal is at least one kind selected from the group consisting of Pt and Pd, and Ib metal is at least one kind selected from the group consisting of Ag and Au.

7. The multi-layer piezoelectric element according to claim 5;
    wherein the group VIII metal is Ni.

8. The multi-layer piezoelectric element according to claim 5;
    wherein the group Ib metal is Cu.

9. The multi-layer piezoelectric element according to claim 3,
    wherein the internal electrode includes an inorganic component different from the metal which is main component.

10. The multi-layer piezoelectric element according to claim 9,
    wherein the inorganic component includes a perovskite type oxide constituted from $PbZrO_3$-$PbTiO_3$ as a main component.

11. The multi-layer piezoelectric element according to claim 1,
    wherein the piezoelectric layer includes a perovskite type oxide as a main component.

12. The multi-layer piezoelectric element according to claim 11,
    wherein the piezoelectric layer includes a perovskite type oxide constituted from $PbZrO_3$-$PbTiO_3$ as a main component.

13. The multi-layer piezoelectric element according to claim 1,
    wherein the stack is fired at a temperature of 900° C. or more and 1000° C. or less.

14. The multi-layer piezoelectric element according to claim 1,
    wherein a change in the composition of the internal electrode before and after firing is 5% or less.

15. The multi-layer piezoelectric element according to claim 1, the internal electrodes including first internal electrodes and second internal electrodes stacked one on another alternately, end portions of the first internal electrodes being exposed on the first side face of the stack while end portions of the second internal electrodes being located apart from the first side face, the end portions of the second internal electrodes being exposed on the second side face of the stack while the end portions of the first internal electrodes being located apart from the second side face,
    wherein the first side face has grooves formed toward the end portions of the second electrodes and the second side face has grooves formed toward the end portions of the first electrodes, the grooves being filled with a dielectric material of which Young's modulus is lower than that of the piezoelectric material.

16. A multi-layer piezoelectric element comprising a stack formed by stacking piezoelectric layers and internal electrodes one on another alternately, wherein a minimum crystal grain size of a portion of the piezoelectric material that makes contact with the internal electrode is larger than a minimum crystal grain size of other portion.

* * * * *